United States Patent
Han et al.

(10) Patent No.: US 11,093,059 B2
(45) Date of Patent: Aug. 17, 2021

(54) DISPLAY DEVICE

(71) Applicant: Samsung Display Co., Ltd., Yongin-si (KR)

(72) Inventors: Inyoung Han, Yongin-si (KR); Jonghwa Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/296,587

(22) Filed: Mar. 8, 2019

(65) Prior Publication Data

US 2020/0110495 A1 Apr. 9, 2020

(30) Foreign Application Priority Data

Oct. 5, 2018 (KR) .................. 10-2018-0119312

(51) Int. Cl.
G06F 3/044 (2006.01)
G06F 3/041 (2006.01)
H01L 27/32 (2006.01)

(52) U.S. Cl.
CPC ............ *G06F 3/0412* (2013.01); *G06F 3/044* (2013.01); *G06F 2203/04111* (2013.01); *H01L 27/323* (2013.01)

(58) Field of Classification Search
CPC ............ G06F 3/0412; G06F 3/044; G06F 2203/04111; H01L 27/323
See application file for complete search history.

(56) References Cited

U.S. PATENT DOCUMENTS

| | | | | |
|---|---|---|---|---|
| 10,930,885 | B2* | 2/2021 | Kim | H01L 51/5246 |
| 2009/0161047 | A1* | 6/2009 | Cho | G02F 1/133516 349/106 |
| 2013/0321332 | A1* | 12/2013 | Yoshimura | G06F 3/04182 345/174 |
| 2016/0011633 | A1* | 1/2016 | Watanabe | G09G 3/3648 345/184 |
| 2016/0202516 | A1* | 7/2016 | Watanabe | G02F 1/1339 349/130 |
| 2017/0031323 | A1* | 2/2017 | Kim | H01L 27/3258 |
| 2017/0154566 | A1* | 6/2017 | Ryoo | G09G 3/3648 |
| 2017/0186891 | A1* | 6/2017 | Min | H01L 27/3227 |
| 2017/0187934 | A1* | 6/2017 | Kwak | G02F 1/133512 |
| 2017/0227804 | A1* | 8/2017 | Nagasawa | G02F 1/1339 |
| 2017/0287992 | A1* | 10/2017 | Kwak | H01L 27/3234 |
| 2018/0157362 | A1* | 6/2018 | Kim | G06F 3/041 |

FOREIGN PATENT DOCUMENTS

| | | | |
|---|---|---|---|
| JP | 2015231444 A | | 12/2015 |
| KR | 20170043775 A | * | 4/2017 |
| KR | 1020170043775 A | | 4/2017 |
| KR | 1020170064598 A | | 6/2017 |
| KR | 1020170111827 A | | 10/2017 |
| KR | 1020170137230 A | | 12/2017 |
| KR | 1020180063633 A | | 6/2018 |

* cited by examiner

Primary Examiner — Carolyn R Edwards
(74) Attorney, Agent, or Firm — Cantor Colburn LLP

(57) ABSTRACT

A display device includes: a substrate including an opening defined therein, a display area adjacent to the opening, and a non-display area extended along the opening to be disposed between the opening and the display area; a display element with which an image is displayed, on the substrate in the display area thereof; and a metal layer including a plurality of segments spaced apart from each other, each segment disposed in the non-display area of the substrate.

20 Claims, 15 Drawing Sheets

FIG. 9B_1
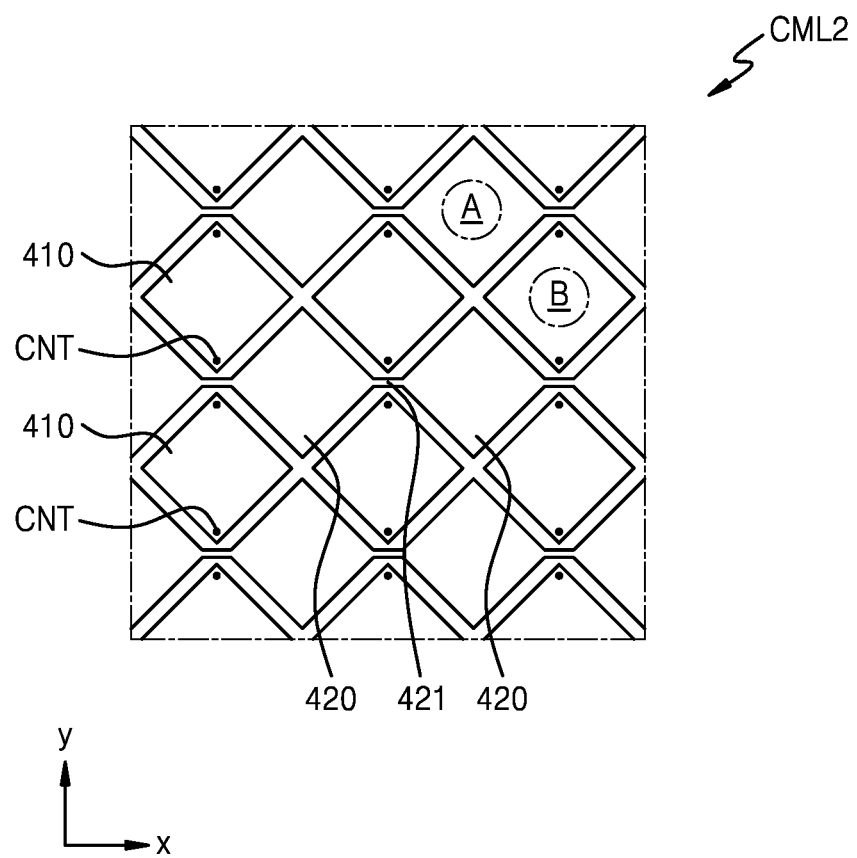

FIG. 9B_2
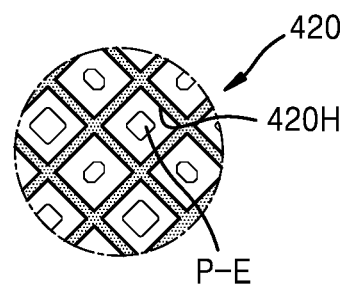
FIG. 9B_3
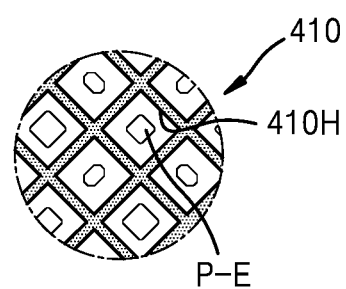

DISPLAY DEVICE

This application claims priority to Korean Patent Application No. 10-2018-0119312, filed on Oct. 5, 2018, and all the benefits accruing therefrom under 35 U.S.C. § 119, the disclosure of which is incorporated herein in its entirety by reference.

BACKGROUND

1. Field

One or more embodiments relate to a display device, and more particularly, to a display device including an opening area.

2. Description of the Related Art

Purposes of a display device have become more diversified. Also, as display devices have become thinner and more lightweight, their range of use has gradually been extended.

As an area occupied by a display area of a display device increases, functions that may be combined or associated with the display device are being added. As a way of adding various functions while increasing the display area, research into a display device including an opening in the display area is under progress.

SUMMARY

One or more embodiments include a display device including an opening area or an opening that is at least partially surrounded by a display area.

Additional features will be set forth in part in the description which follows and, in part, will be apparent from the description, or may be learned by practice of the presented embodiments.

According to one or more embodiments, a display device includes: a substrate including a first area, a second area adjacent to the first area, and a third area between the first area and the second area; a display element with which an image is displayed, on the substrate in the second area thereof; and a metal layer including a plurality of segments spaced apart from each other, each segment disposed in the third area.

The metal layer may include a metal having a light-blocking characteristic.

The plurality of segments may be arranged spaced apart from each other along an outer edge of the first area.

The display device may further include: a signal wiring portion being in the third area. The signal wiring portion may be interposed between the metal layer and the substrate.

The display device may further include a scan signal line or a data signal line connected to the display element in the second area. The scan signal line or the data signal line may extend from the second area to dispose a portion of the scan signal line or the data signal line in the third area, and the portion of the scan signal line or the data signal line in the third area may define the signal wiring portion in the third area.

The display device may further include: an input sensing layer on the display element, the input sensing layer including first sensing electrodes arranged along a first direction and second sensing electrodes arranged along a second direction which intersects with the first direction.

The metal layer and the first sensing electrodes may respectively be portions of a same material layer, or the metal layer and the second sensing electrodes may respectively be portions of a same material layer.

The plurality of segments may include a first segment electrically connected to one of the first sensing electrodes and a second segment electrically connected to one of the second sensing electrodes.

The first segment may be closer to the first sensing electrode than the second sensing electrode.

According to one or more embodiments, a display device includes: a substrate including a display area in which are defined: an opening; and a non-display area between the opening and the display area; a plurality of display elements in the display area and including a first display element and a second display element which are spaced apart each other with the opening therebetween; a signal wiring in the non-display area, the signal wiring electrically connected to the first and second display elements; and a metal layer in the non-display area.

The metal layer may at least partially overlap the signal wiring in the non-display area.

The metal layer may include a plurality of segments spaced apart from each other along an outer edge of the opening.

The display device may further include: an input sensing layer on the display elements, the input sensing layer including first sensing electrodes along a first direction and second sensing electrodes which intersects with the first direction.

The metal layer and the first sensing electrodes may respectively be portions of a same material layer, or the metal layer and the second sensing electrodes may respectively be portions of a same material layer.

According to one or more embodiments, a display device includes: a substrate including a display area in which are defined: an opening; and a non-display area between the opening and the display area; a plurality of display elements in the display area and with which an image is displayed, the display elements arranged along the opening; an input sensing layer on the display elements; and a metal layer in the non-display area.

The input sensing layer may include first sensing electrodes arranged along a first direction and second sensing electrodes arranged along a second direction which intersects with the first direction, and the metal layer may include a segment connected to one of the first sensing electrodes or one of the second sensing electrodes.

The metal layer may include a plurality of segments.

A first sensing electrode among the first sensing electrodes and a second sensing electrode among the second sensing electrodes may be arranged adjacent to each other along the opening. The plurality of segments may include a first segment connected to the first sensing electrode, and a second segment connected to the second sensing electrode.

The plurality of segments may be spaced apart from each other along an outer edge of the opening.

The metal layer and the input sensing layer may be respective portions of a same material layer.

BRIEF DESCRIPTION OF THE DRAWINGS

These and/or other features will become apparent and more readily appreciated from the following description of the embodiments, taken in conjunction with the accompanying drawings in which:

FIGS. 9B_1, 9B_2 and 9B_3 are enlarged top plan views of an embodiment of a second conductive layer of the input sensing layer of FIG. 8;

DETAILED DESCRIPTION

Figure 1:
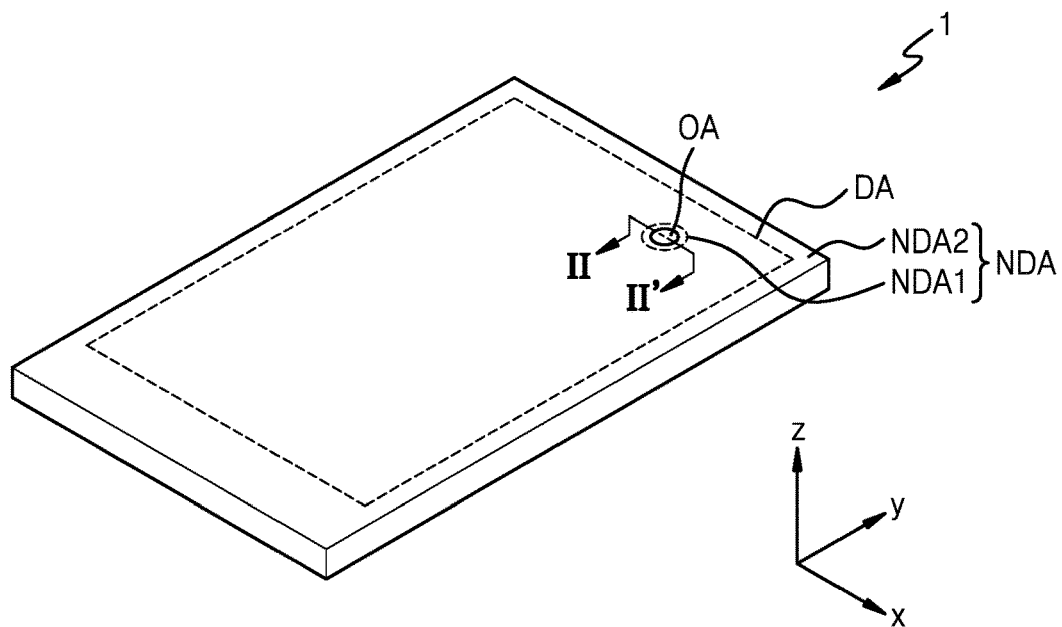
FIG. 1 is a perspective view of an embodiment of a display device.

As the disclosure allows for various changes and numerous embodiments, exemplary embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the exemplary embodiments set forth herein.

Hereinafter, the disclosure will be described more fully with reference to the accompanying drawings, in which exemplary embodiments of the disclosure are shown. When description is made with reference to the drawings, like reference numerals in the drawings denote like or corresponding elements, and repeated description thereof will be omitted.

As used herein, the term "and/or" includes any and all combinations of one or more of the associated listed items.

Expressions such as "at least one of" when preceding a list of elements, modify the entire list of elements and do not modify the individual elements of the list. For example, "at least one of a, b or c" may be understood that only a, only b, only c, both a and b, both a and c, both b and c, all of a, b, and c, or variations thereof.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being related to another element such as being "on" another layer, region, or component, it can be directly or indirectly on the other layer, region, or component. That is, for example, intervening layers, regions, or components may be present between the elements. In contrast, when a layer, region, or component is referred to as being related to another element such as being "directly on" another layer, region, or component, no intervening layers, regions, or components are present.

Sizes of elements in the drawings may be exaggerated for convenience of explanation. In other words, since sizes and thicknesses of components in the drawings are arbitrarily illustrated for convenience of explanation, the following embodiments are not limited thereto.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

One or more embodiments may reduce or effectively prevent a wiring, etc. arranged outside a display area of a display device from being viewed from outside the display device due to external light being reflected at such wiring, etc. However, it should be understood that effects described herein should be considered in a descriptive sense only and not for limitation of the disclosure.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component by having no intervening layer, region, or component therebetween or may be "indirectly connected or electrically connected" to other layer, region, or component with another layer, region, or component interposed therebetween.

FIG. 1 is a perspective view of an embodiment of a display device 1.

Referring to FIG. 1, the display device 1 includes a display area DA at which the display device 1 emits light and a non-display area NDA at which the display device 1 does not emit light. That is, an image may be displayed at the display area DA while not being displayed at the non-display area NDA. The non-display area NDA is arranged adjacent to the display area DA along a plane defined by two directions which cross each other. The display device 1 may provide a predetermined image by using light emitted from a pixel arranged in plurality within the display area DA.

The display device 1 includes an opening area (or a first area) OA that is at least partially surrounded by the display area (or a second area) DA. In an embodiment, FIG. 1 shows that the opening area OA is entirely surrounded by the display area DA. The non-display area NDA may include a first non-display area NDA1 (or a third area, a middle area between the first area and the second area) surrounding the opening area OA, and a second non-display area NDA2 (or a fourth area, a peripheral area) surrounding an outer periphery of the display area DA. The first non-display area NDA1 may entirely surround the opening area OA, the display area DA may entirely surround the first non-display area NDA1, and the second non-display area NDA2 may entirely surround the display area DA. The opening area OA, the display area DA and the non-display area NDA may together define or correspond to an entire planar area of a front (or viewing) surface of the display device 1. The opening area OA, the display area DA and the non-display area NDA described above for the display device 1 may also be applied to corresponding areas of components within the display device 1.

Though an organic light-emitting display device is exemplarily described as the display device 1 according to an embodiment below, the display device 1 is not limited thereto. In another embodiment, various types of display devices such as an inorganic light-emitting display and a quantum dot light-emitting display may be used.

Figure 2:
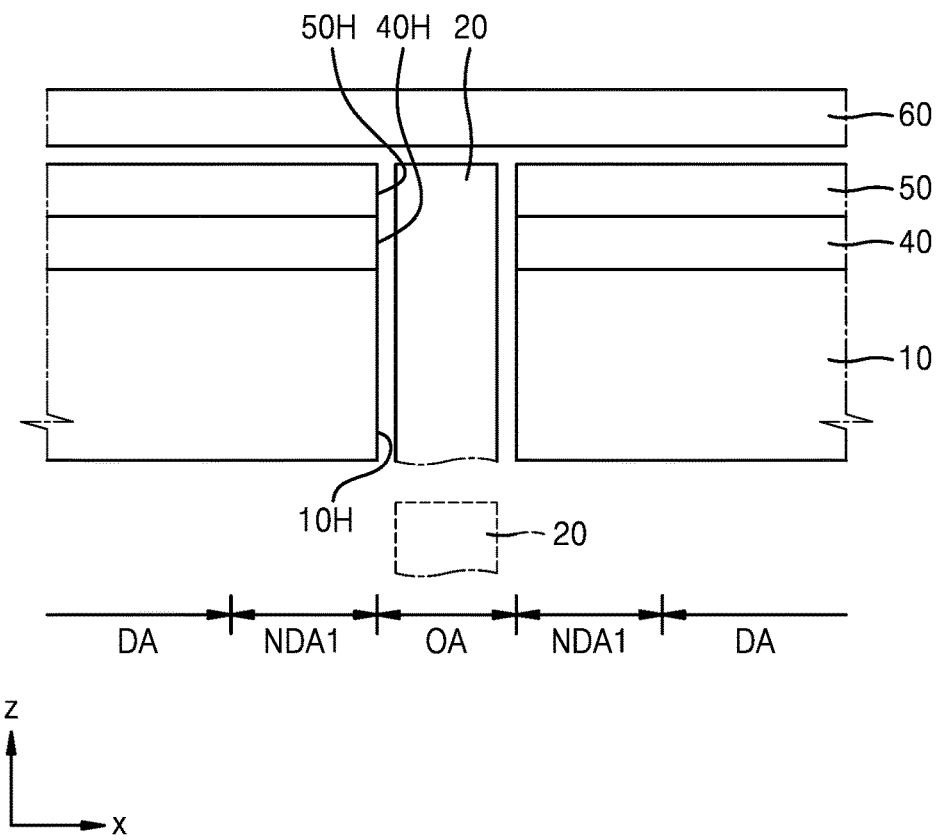
FIG. 2 is a cross-sectional view of an embodiment of the display device taken along line II-II' of FIG. 1.

FIG. 2 is a cross-sectional view of an embodiment of a display device and corresponds to a cross-section taken along line II-II' of FIG. 1.

Referring to FIG. 2, the display device 1 may include a display panel 10, an input sensing layer 40 arranged on the display panel 10, and an optical functional layer (or anti-reflection layer) 50. These layers may be covered by a window 60. The display device 1 may represent or include various electronic devices such as mobile phones, notebook computers, and smartwatches. The window 60 may form an outer surface of the display device 1, such as the front (or viewing) surface of the display device 1.

The display panel 10 may display an image. The display panel 10 includes a pixel arranged in plurality within the display area DA. Each of the pixels may include a display element and a pixel circuit which is connected thereto. The display element may include an organic light-emitting diode, an inorganic light-emitting diode, or a quantum dot light-emitting diode. The display element under control of the pixel circuit may generate and/or emit light to generate an image for display by the display device 1.

The input sensing layer 40 obtains coordinate information corresponding to an external input, for example, a touch event. The input sensing layer 40 may include a sensing electrode (or a touch electrode) and a signal line which is connected to the sensing electrode. The input sensing layer 40 may be arranged on the display panel 10.

The input sensing layer 40 may be directly formed on the display panel 10 or may be formed separately and then coupled by using an adhesive layer such as an optical clear adhesive ("OCA"). In an embodiment, for example, layers or elements of the input sensing layer 40 may be successively formed on the display panel 10 after a process of forming the display panel 10, such that the input sensing layer 40 is directly formed on the display panel 10. In this case, the adhesive layer may not be arranged between the input sensing layer 40 and the display panel 10. Though FIG. 2 shows that the input sensing layer 40 is arranged between the display panel 10 and the optical functional layer 50, the optical functional layer 50 may be between the input sensing layer 40 and the display panel 10 in another embodiment.

The optical functional layer 50 may include a reflection prevention layer. The reflection prevention layer may reduce reflectivity of light (external light) incident from outside the display device 1 and toward the display panel 10 through the window 60. The reflection prevention layer may include a retarder and a polarizer. The retarder may include a film type retarder or a liquid crystal type retarder. The retarder may include a λ/2 retarder and/or a λ/4 retarder. The polarizer may include a film type polarizer or a liquid crystal type polarizer. The film type polarizer may include a stretchable synthetic resin film, and the liquid crystal type polarizer may include liquid crystals arranged in a predetermined arrangement. Each of the retarder and the polarizer may further include a protective film. The retarder and the polarizer themselves or their protective films may be defined as a base layer of the reflection prevention layer.

In another embodiment, the reflection prevention layer may include a black matrix and color filters. The color filters may be arranged taking into account colors of light emitted respectively from pixels of the display panel 10. In another embodiment, the reflection prevention layer may include a cancelling interference structure. The cancelling interference structure may include a first reflection layer and a second reflection layer respectively arranged in different layers. First reflected light and second reflected light respectively reflected by the first reflection layer and the second reflection layer may create destructive-interference and thus reflectivity of external light may be reduced.

The optical functional layer 50 may include a lens layer. The lens layer may improve emission efficiency of light emitted from the display panel 10 or reduce color deviation of the light. The lens layer may include a layer having a concave or convex lens shape and/or include a plurality of layers respectively having different refractive indexes. The optical functional layer 50 may include both the reflection prevention layer and the lens layer or include only one among the reflection prevention layer and the lens layer.

The display panel 10, the input sensing layer 40, and/or the optical functional layer 50 may include an opening defined therein. With regard to this, FIG. 2 shows that the display panel 10, the input sensing layer 40, and the optical functional layer 50 respectively include first to third openings 10H, 40H, and 50H defined therein and that the first to third openings 10H, 40H, and 50H thereof overlap each other to collectively form a single opening. The first to third openings 10H, 40H, and 50H are located to correspond to the opening area OA of the display device 1. In another embodiment, at least one of the display panel 10, the input sensing layer 40, or the optical functional layer 50 may not include an opening at the opening area OA. In an embodiment, for example, one or two among the display panel 10, the input sensing layer 40, and the optical functional layer 50 may not include an opening. Hereinafter, the opening area OA may denote at least one of the first to third openings 10H, 40H, or 50H respectively of the display panel 10, the input sensing layer 40, and the optical functional layer 50. In an embodiment, for example, in the present specification, the opening area OA may denote the first opening 10H of the display panel 10.

A component 20 of the display device 1 may correspond to an opening area OA. As shown by a solid line of FIG. 2, the component 20 may be located inside the first to third openings 10H, 40H, and 50H, or as shown by a dashed line, the component 20 may be located below the display panel 10 at an outside thereof but corresponding to allocation of the opening area OA.

The component 20 may include an electronic element. In an embodiment, for example, the component 20 may include an electronic element that uses light or sound to perform a function, etc. In an embodiment, for example, the electronic element may be a sensor such as an infrared sensor that emits and/or receives light, a camera that receives light and captures an image, a sensor that outputs and senses light or sounds to measure a distance or recognize a fingerprint relative to the display device 1, a relatively small lamp that outputs light, and/or a speaker that outputs sounds. An electronic element that uses light may use light in various wavelength bands such as visible light, infrared light, and ultraviolet light.

In an embodiment, the opening area OA may be understood as a transmission area through which light and/or sounds, which are output from the component 20 to outside thereof or through which light and/or sounds, which propagate toward the electronic element from the outside may pass. At the opening area OA, the component 20 and/or any of the layers in which an opening is defined may be exposed to the window 60. That is, the component 20 and/or any of the layers in which an opening is defined may not be exposed to outside the overall display device 1 since the window 60 does not include an opening corresponding to the opening area OA.

In another embodiment, in the case where the display device 1 is used as a smartwatch or an instrument panel for an automobile, the component 20 may be a member including a needle of a clock or a needle, etc. indicating predetermined information (e.g. the velocity of a vehicle, etc.). In the case where the display device 1 includes a needle of a clock or an instrument panel for an automobile, the component 20 may be exposed to outside the overall display device 1 through the window 60, which may include an opening corresponding to the opening area OA.

As described above, the component 20 may include element(s) related to a function of the display panel 10 or an element such as an accessory that increases an esthetic sense of the display panel 10.

Though FIG. 2 shows that the window 60 is spaced apart from the optical functional layer 50 by a predetermined interval, a layer including an optical transparent adhesive, etc. may be located between the window 60 and the optical functional layer 50.

Figure 3:
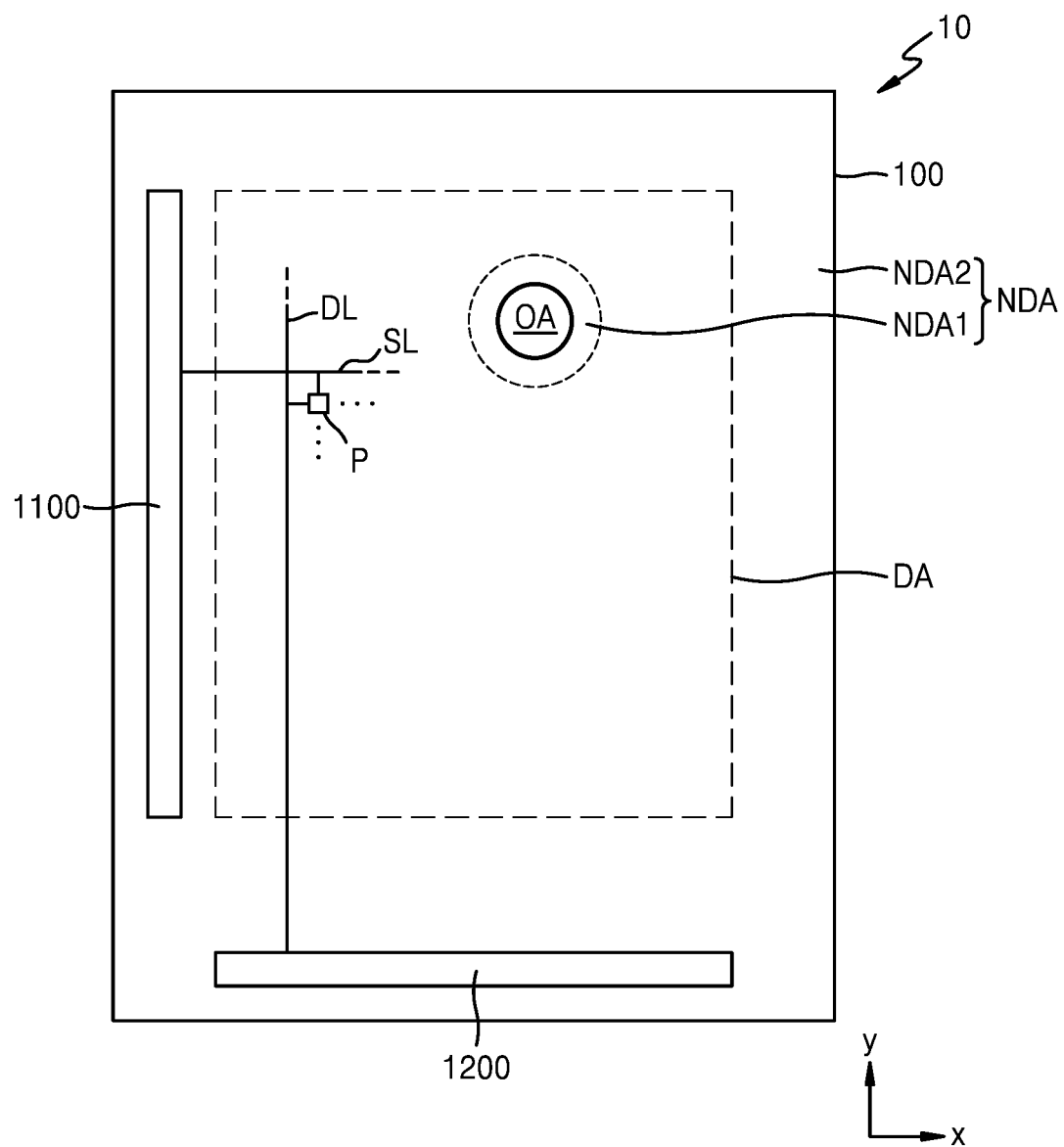
FIG. 3 is a top plan view of an embodiment of a display panel of a display device.
Figure 4:
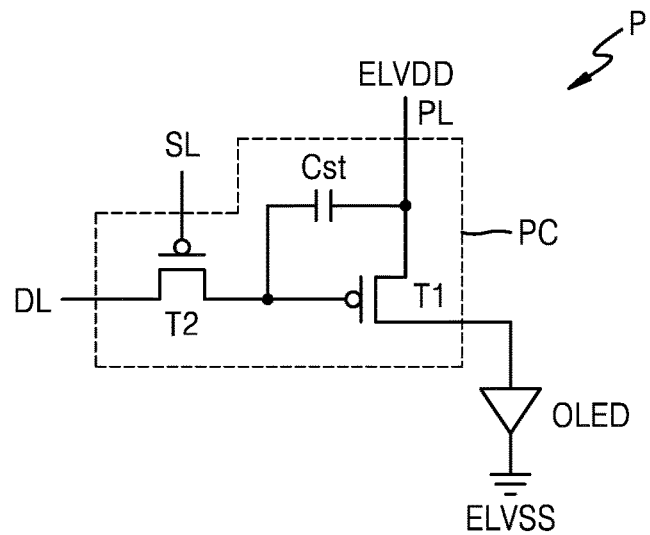
FIG. 4 is an equivalent circuit diagram of an embodiment of a pixel of a display panel.

FIG. 3 is a top plan view of an embodiment of a display panel of a display device, and FIG. 4 is an equivalent circuit diagram of an embodiment of a pixel of a display panel.

Referring to FIG. 3, the display panel 10 includes the display area DA and the first and second non-display areas NDA1 and NDA2. FIG. 3 may be understood as a view of features relative to a substrate 100 in the display panel 10. In an embodiment, for example, the substrate 100 may be understood to have the opening area OA, the first and second non-display areas NDA1 and NDA2. Though not shown, the substrate 100 may include an opening corresponding to the opening area OA, for example, an opening that passes completely through a thickness of the substrate 100 from a top surface thereof to a bottom surface thereof as described below in FIG. 14.

The display panel 10 includes a pixel P arranged in plurality in the display area DA. As shown in FIG. 4, each pixel P includes a pixel circuit PC and an organic light-emitting diode OLED as a display element which is connected to the pixel circuit PC. In an embodiment, the pixel P, the pixel circuit PC, and elements of each of these features may be provided in plurality on the substrate 100. The pixel circuit PC may include a first thin film transistor T1, a second thin film transistor T2, and a storage capacitor Cst. Each pixel P may emit, for example, red, green, blue, or white light through the organic light-emitting diode OLED.

The second thin film transistor T2 is a switching thin film transistor, may be connected to a scan line SL and a data line DL, and may transfer a data voltage that is input from the data line DL to the first thin film transistor T1 in response to a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor, may be connected to the driving voltage line PL and the storage capacitor Cst, and may control an electrical driving current flowing through the organic light-emitting diode OLED from the driving voltage line PL in response to a voltage value stored in the storage capacitor Cst. The organic light-emitting diode OLED may emit light having predetermined brightness by using the driving current. An opposite electrode (e.g. a cathode) of the organic light-emitting diode OLED may receive a second power voltage ELVSS.

Though it is described with reference to FIG. 4 that the pixel circuit PC includes two thin film transistors and one storage capacitor, the present disclosure is not limited thereto. The number of thin film transistors and/or the number of storage capacitors may be variously changed depending on a design of the pixel circuit PC.

Referring to FIG. 3 again, the first non-display area NDA1 may surround the opening area OA. The first non-display area NDA1 is an area in which a display element such as an organic light-emitting diode OLED is not arranged. Signal lines that provide a signal to pixels P provided around the opening area OA may pass across, or groove(s), which will be described below, may be arranged in the first non-display area NDA1. A scan driver 1100 that provides a scan signal to each pixel P, a data driver 1200 that provides a data signal to each pixel P, a conductive main power wiring (not shown) that provides first and second power voltages ELVDD and ELVSS, etc. may be arranged in the second non-display area NDA2. Though FIG. 3 shows the data driver 1200 is adjacent to one lateral side of the substrate 100, the data driver 1200 may be arranged on a flexible printed circuit board ("FPCB") (not shown) electrically connected to a pad (not shown) of the display panel 10 arranged on one side of the display panel 10 according to another embodiment.

Figure 5:
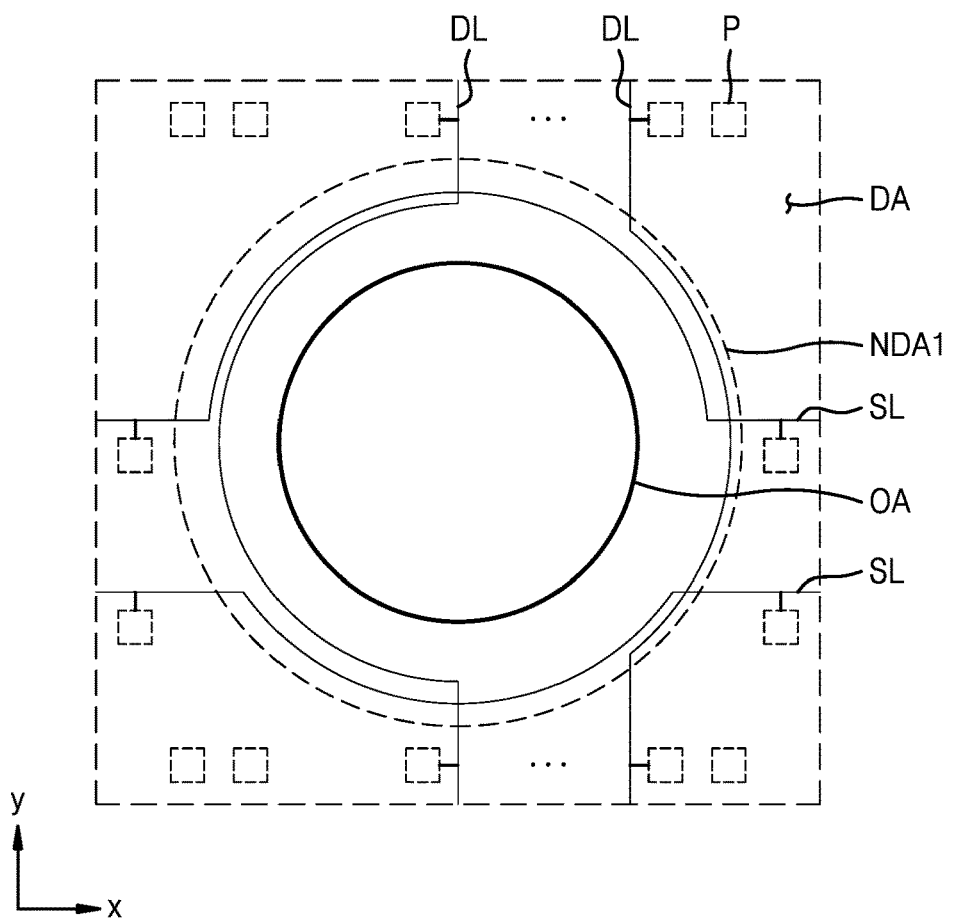
FIG. 5 is an enlarged top plan view of an embodiment of a portion of a display panel.

FIG. 5 is an enlarged top plan view of an embodiment of a portion of the display panel 10 and shows conductive wirings, for example, signal lines located in the first non-display area NDA1.

Referring to FIG. 5, pixels P may be arranged around the opening area OA in the display area DA, and the first non-display area NDA1 may be located between the opening area OA and the display area DA.

Pixels P may be spaced apart from each other around the opening area OA. The opening area OA may be located between pixels P. In an embodiment, for example, the pixels P may be arranged up and down with the opening area OA therebetween and/or arranged left and right with the opening area OA therebetween.

Signal lines that are adjacent to the opening area OA among signal lines that supply a signal to the pixels P may detour around the opening area OA. That is, a signal line outside of the first non-display area NDA1 may have an extension direction, but at the first non-display area NDA1, the signal line may deviate from the extension direction such that the signal line detours around the opening area OA. Some data lines DL among data lines DL that pass across the display area DA may extend in a y-direction, provide a data signal to the pixels P arranged along the y-direction with the opening area OA therebetween, and detour along an edge of the opening area OA in the first non-display area NDA1. Some scan lines SL among scan lines SL that pass across the display area DA may extend in an x-direction, provide a scan signal to the pixels P arranged along the x-direction with the opening area OA therebetween, and detour along an edge of the opening area OA in the first non-display area NDA1.

The display device 1 and components thereof may be disposed in a plane which is parallel to a plane defined by the x-direction and the y-direction crossing each other. A thickness of the display device 1 and components thereof extends along a z-direction which crosses each of the x-direction and y-direction.

Figure 6:
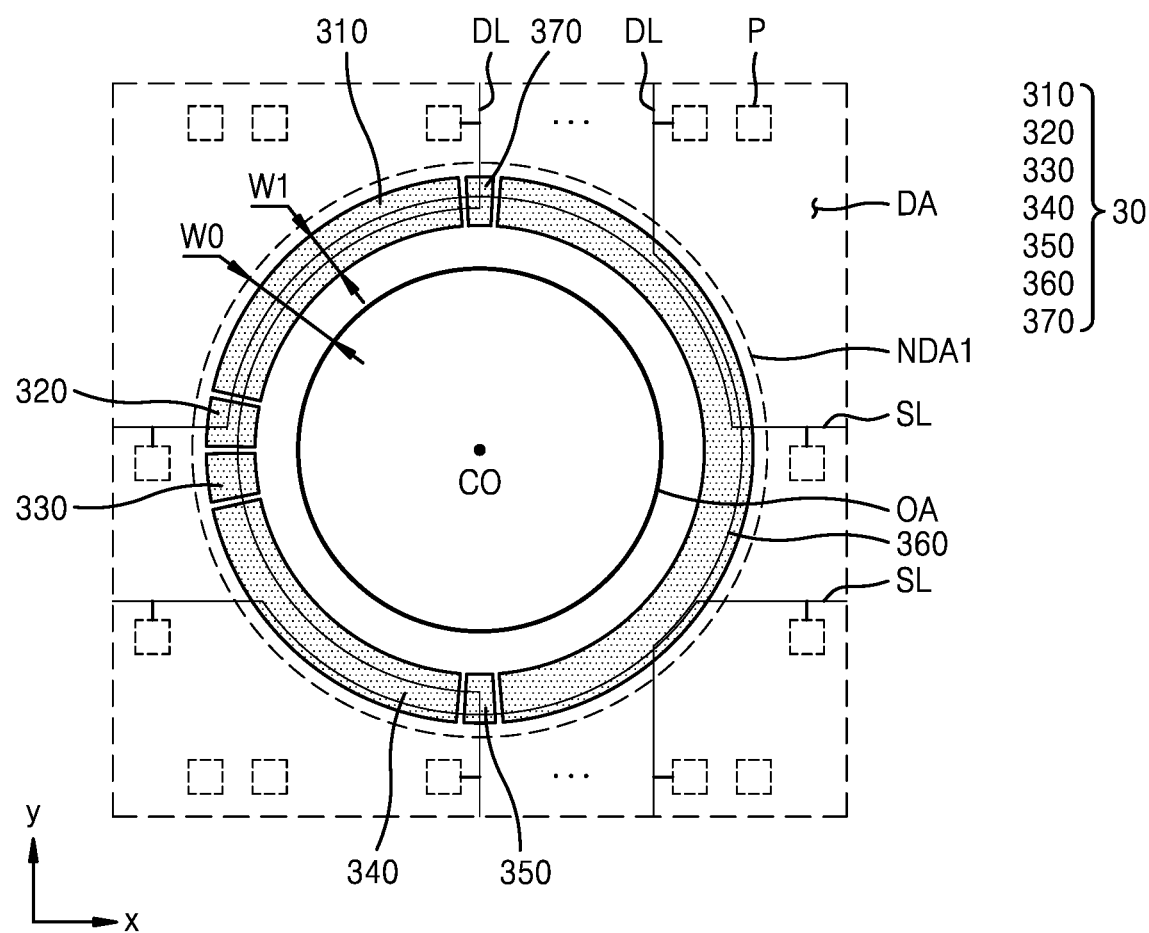
FIG. 6 is an enlarged top plan view of another embodiment of a portion of a display panel.

FIG. 6 is an enlarged top plan view of another embodiment of a portion of the display panel 10 and shows a metal layer and signal lines located in the first non-display area NDA1.

Referring to FIG. 6, a metal layer 30 is arranged in the first non-display area NDA1 surrounding the opening area OA. A width (radial width) W1 of the metal layer 30 may be less than a width (radial width) W0 of the first non-display area NDA1. Alternatively, the width W1 of the metal layer 30 may be the same as the width W0 of the first non-display area NDA1. Here, the width W1 of the metal layer 30 and the width W0 of the first non-display area NDA1 may represent distances in a radial direction from a center CO of the opening area OA.

The metal layer 30 may include a metal as a material that does not transmit light, that is, having a light-blocking characteristic. In an embodiment, for example, the metal layer 30 may include Mo, Al, Cu, and/or Ti. The metal layer 30 may include a multi-layer structure or a single layer structure including one or more of the above-mentioned materials. In an embodiment, the metal layer 30 may include a multi-layer structure of Ti/Al/Ti.

The metal layer 30 may at least partially cover signal lines arranged thereunder, for example, the data lines DL and/or the scan lines SL described with reference to FIG. 5. Light incident from the outside toward the display panel 10 may be reflected by the data lines and/or the scan lines which are not covered by a light-blocking element. However, according to one or more embodiment, the metal layer 30 may reduce or effectively prevent light reflected by the data lines DL and/or the scan lines SL from being provided or viewable to a user outside the display panel 10 by blocking the light progressing from outside the display panel 10 (or the display device 1) toward the data lines DL and/or the scan lines SL.

The metal layer 30 may collectively include a plurality of segments. With regard to this, though FIG. 6 shows that the metal layer 30 includes first to seventh segments 310, 320, 330, 340, 350, 360, and 370, the present disclosure is not limited thereto. The metal layer 30 may include two or more segments and the number of segments may be variously changed.

The first to seventh segments 310, 320, 330, 340, 350, 360, and 370 may be arranged in a circumferential direction that surrounds an edge of the opening area OA. The first to seventh segments 310, 320, 330, 340, 350, 360, and 370 may be spaced apart from each other along the circumferential direction.

In an embodiment of manufacturing a display device, the metal layer 30 may be simultaneously formed during a process of forming the input sensing layer 40 described with reference to FIG. 2. The metal layer 30 and the input sensing layer 40 may be disposed in a same layer of the display device 1 among layers thereof. As being 'in same layer' or 'simultaneously formed,' features may respectively be portions of a same material layer. With regard to a structure of the metal layer 30, the input sensing layer 40 is described first and then the structure of the metal layer 30 is described below.

Figure 7:
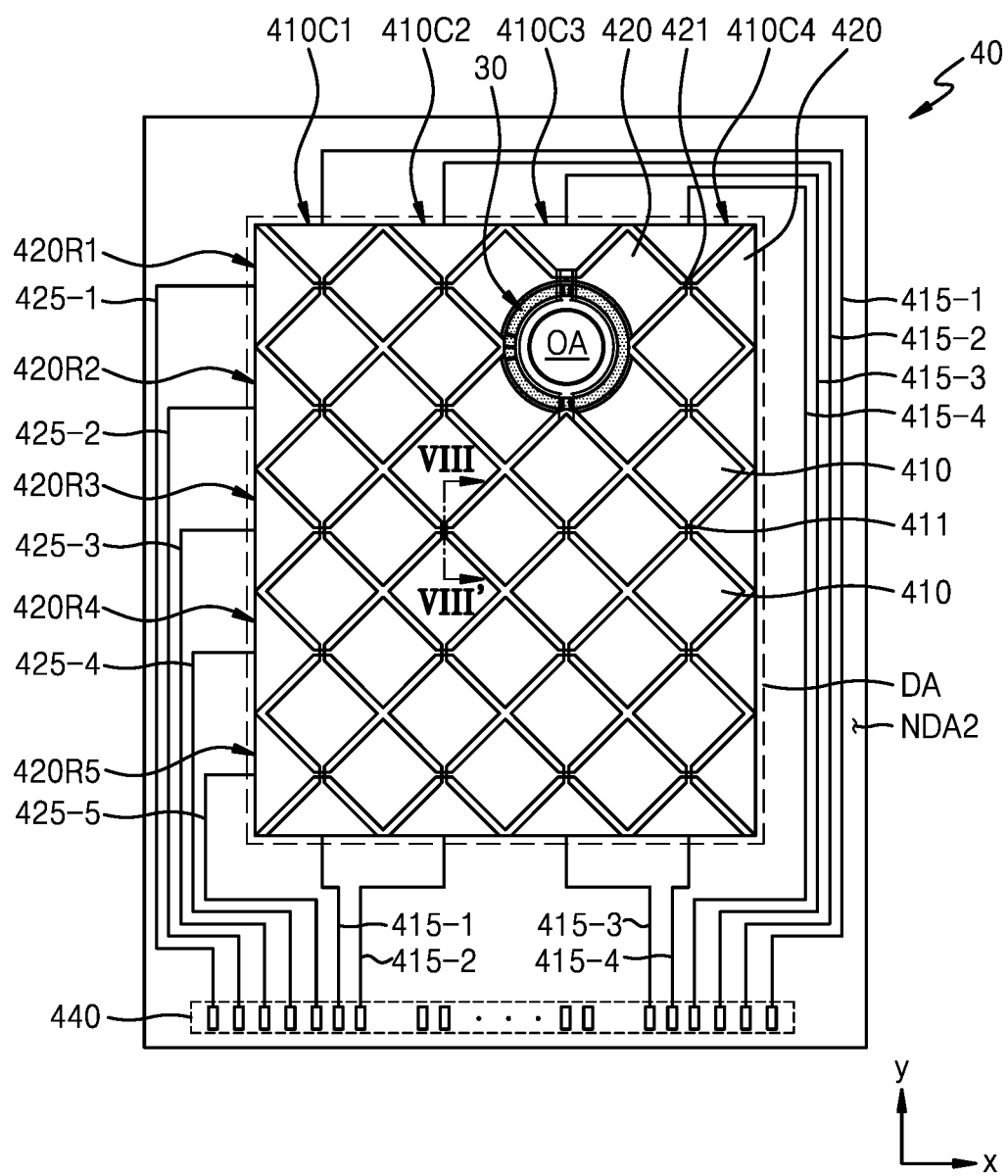
FIG. 7 is a top plan view of an embodiment of an input sensing layer of a display panel.
Figure 8:
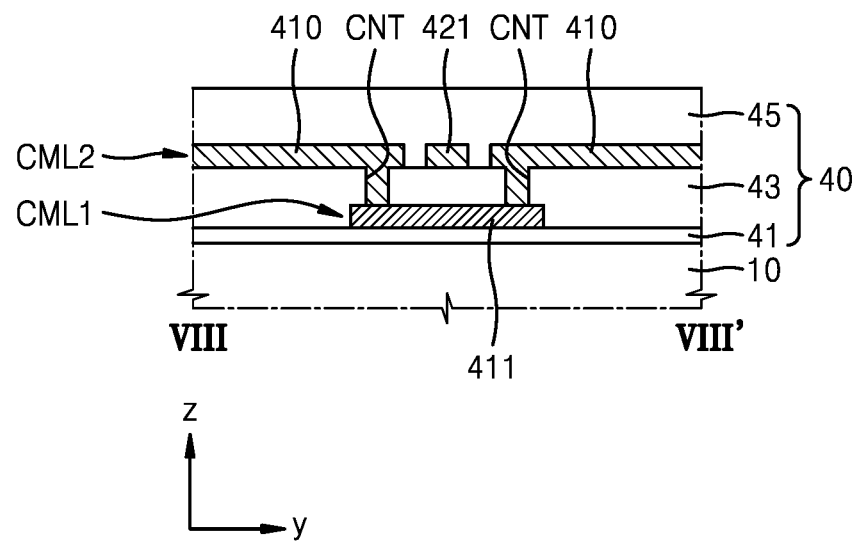
FIG. 8 is a cross-sectional view of the input sensing layer taken along line VIII-VIII' of FIG. 7.
Figure 9A:
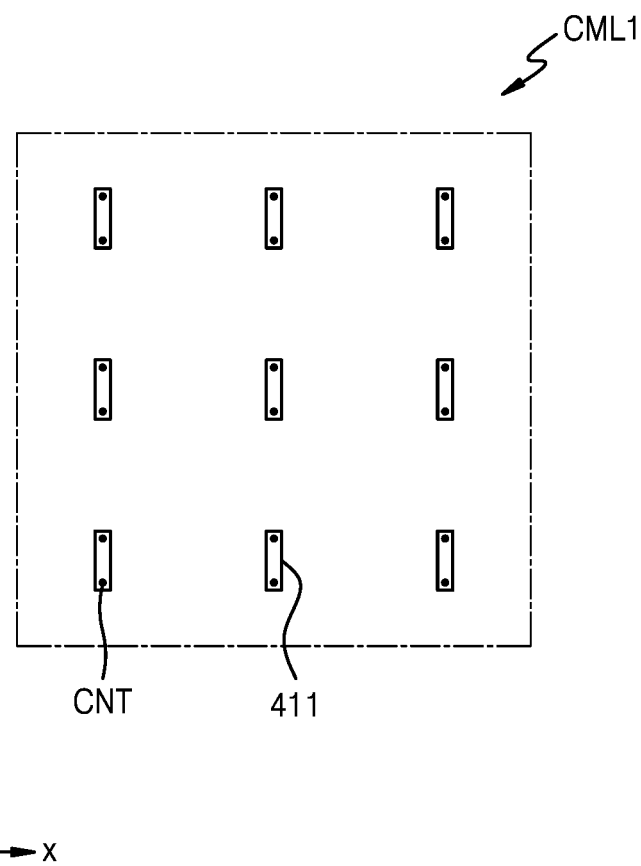
FIG. 9A is an enlarged top plan view of an embodiment of a first conductive layer of the input sensing layer of FIG. 8.

FIG. 7 is a top plan view of an embodiment of the input sensing layer 40 on the display panel 10, FIG. 8 is a cross-sectional view of the input sensing layer 40 taken along line VIII-VIII' of FIG. 7, FIG. 9A is an enlarged top plan view of an embodiment of a first conductive layer CML1 of the input sensing layer 40 of FIG. 8, and FIGS. 9B_1, 9B_2 and 9B_3 are enlarged top plan views of an embodiment of a second conductive layer CML2 of the input sensing layer 40 of FIG. 8. FIGS. 9B_2 and 9B_3 are respectively views of regions A and B shown in FIG. 9B_1.

Referring to FIG. 7, the input sensing layer 40 may include first sensing electrodes 410, first trace lines 415-1, 415-2, 415-3, and 415-4 connected to the first sensing electrodes 410, second sensing electrodes 420, and second trace lines 425-1, 425-2, 425-3, 425-4, and 425-5 connected to the second sensing electrodes 420. The input sensing layer 40 may sense an external pressure thereto by using a mutual cap method and/or a self-cap method. In embodiments, a voltage applied to the first sensing electrodes 410 may be different from a voltage applied to the second sensing electrodes 420, within the input sensing layer 40.

The first sensing electrodes 410 may be arranged in the y-direction, and the second sensing electrodes 420 may be arranged in the x-direction that intersects or crosses the y-direction. The first sensing electrodes 410 arranged in the y-direction may be connected to each other by a first connection electrode 411 between neighboring first sensing electrodes 410 and together may respectively constitute first sensing lines 410C1, 410C2, 410C3, and 410C4 lengthwise extended along the y-direction. The second sensing electrodes 420 arranged in the x-direction may be connected to each other by a second connection electrode 421 between neighboring second sensing electrodes 420 and together may respectively constitute second sensing lines 420R1, 420R2, 420R3, 420R4, and 420R5 lengthwise extended along the x-direction. The first sensing lines 410C1, 410C2, 410C3, and 410C4, and the second sensing lines 420R1, 420R2, 420R3, 420R4, and 420R5 may intersect each other. In an embodiment, for example, the first sensing lines 410C1, 410C2, 410C3 and 410C4, and the second sensing lines 420R1, 420R2, 420R3, 420R4 and 420R5 may be perpendicular to each other.

The first sensing lines 410C1, 410C2, 410C3 and 410C4, and the second sensing lines 420R1, 420R2, 420R3, 420R4 and 420R5 may be arranged in the display area DA and connected to a sensing signal pad 440 through the first trace lines 415-1, 415-2, 415-3, and 415-4 and the second trace lines 425-1, 425-2, 425-3, 425-4, and 425-5 formed in the second non-display area NDA2. The first sensing lines 410C1, 410C2, 410C3 and 410C4 may be respectively connected to the first trace lines 415-1, 415-2, 415-3, and 415-4. The second sensing lines 420R1, 420R2, 420R3, 420R4 and 420R5 may be respectively connected to the second trace lines 425-1, 425-2, 425-3, 425-4, and 425-5.

FIG. 7 shows that each of the first trace lines 415-1, 415-2, 415-3, and 415-4 is connected to a top side and a bottom side of the first sensing lines 410C1, 410C2, 410C3 and 410C4, and sensing sensitivity may be improved through this structure. However, the present disclosure is not limited thereto. In another embodiment, the first trace lines 415-1, 415-2, 415-3, and 415-4 may be connected to only the top side or the bottom side of the first sensing lines 410C1, 410C2, 410C3 and 410C4. The arrangement shape of the first trace lines 415-1, 415-2, 415-3, and 415-4 and the second trace lines 425-1, 425-2, 425-3, 425-4, and 425-5 may be variously changed depending on the shape, size of the display area DA or a sensing method, etc. of the input sensing layer 40.

Planar areas of a first group of the first and second sensing electrodes 410 and 420 that are adjacent to (e.g., closest to) the opening area OA may be less than planar areas of a second group of the first and second sensing electrodes 410 and 420 which are further away from the opening area OA than the first group. The metal layer 30 arranged in a circumferential direction that surrounds the opening area OA may include the same material as that of one of the first and second sensing electrodes 410 and 420 and may be formed during the same process as a process of forming the first and second sensing electrodes 410 and 420 so as to respectively be portions of a same material layer.

The input sensing layer 40 may include a plurality of conductive layers each including a conductive material. Referring to FIG. 8, the input sensing layer 40 may collectively include the first conductive layer CML1 and the second conductive layer CML2 arranged over the display panel 10. A first insulating layer 41 may be arranged between the first conductive layer CML1 and the display panel 10, a second insulating layer 43 may be arranged between the first conductive layer CML1 and the second conductive layer CML2, and a third insulating layer 45 may be arranged on the second conductive layer CML2.

In an embodiment, the first and second insulating layers 41 and 43 may include an inorganic insulating layer such as silicon nitride, and the third insulating layer 45 may include an organic insulating layer. Though FIG. 8 shows that the first insulating layer 41 is arranged between the display panel 10 and the first conductive layer CML1, the first insulating layer 41 may be omitted and the first conductive layer CML1 may be located directly on the display panel 10 in another embodiment. In another embodiment, the first and second insulating layers 41 and 43 may include an organic insulating layer.

As shown in FIGS. 8 and 9A, the first conductive layer CML1 may include the first connection electrodes 411. As shown in FIGS. 8 and 9A, the second conductive layer CML2 may include the first sensing electrodes 410, the second sensing electrodes 420, and the second connection electrodes 421. The second sensing electrodes 420 may be connected to each other by the second connection electrodes 421 disposed or formed in the same layer as that of the second sensing electrodes 420. The first sensing electrodes 410 may be connected to each other by the first connection electrodes 411 formed in a layer different from that of the first sensing electrodes 410. The first connection electrodes 411 that electrically connect neighboring first sensing electrodes 410 may be connected to the neighboring first sensing electrodes 410 through a contact hole CNT formed in the second insulating layer 43.

The first and second conductive layers CML1 and CML2 may include a metal material. In an embodiment, for example, the first and second conductive layers CML1 and CML2 may include Mo, Al, Cu, and/or Ti and may include a multi-layer structure or a single layer structure including the above-mentioned materials. In an embodiment, the first and second conductive layers CML1 and CML2 may include a multi-layer structure of Ti/Al/Ti.

Referring to FIG. 9B_3 as an enlarged view of region B FIG. 9B_1, a single one first sensing electrode 410 may have a conductive grid structure (or a mesh structure, a lattice structure, etc.) including or defined with a plurality of holes 410H. Each of the holes 410H may overlap an emission area P-E of a pixel. Similarly, referring to FIG. 9B_2 as an enlarged view of region A FIG. 9B_1, a single one second sensing electrode 420 may have a conductive grid structure (or a lattice structure) including or defined with a plurality of holes 420H. Each of the holes 420H may overlap an emission area P-E of a pixel.

The metal layer 30 shown in FIG. 7 may be simultaneously formed during a process of forming one of the first conductive layer CML1 and the second conductive layer CML2. In an embodiment, for example, the metal layer 30 may be formed during a process of forming the second conductive layer CML2. In this case, the metal layer 30 may be located in a same layer in which the first sensing electrode 410, the second sensing electrode 420, and/or the second connection electrode 421 are arranged and may include the same material as that of the first sensing electrode 410, the second sensing electrode 420, and/or the second connection electrode 421. In another embodiment, the metal layer 30 may be formed during a process of forming the first conductive layer CML1. In this case, the metal layer 30 may be located in a same layer in which the first connection electrode 411 is arranged and may include the same material as that of the first connection electrode 411.

Though it is described with reference to FIGS. 8, 9B_1, 9B_2 and 9B_3 that the first sensing electrodes 410 and the first connection electrodes 411 are arranged in different layers from each other, the present disclosure is not limited thereto. In another embodiment, the first sensing electrodes 410 and the first connection electrodes 411 may be arranged in a same layer (e.g. the second conductive layer), and the second sensing electrodes 420 and the second connection electrodes 421 may be arranged in different layers from each other and connected through a contact hole that passes through the second insulating layer 43.

Though it is described with reference to FIGS. 8, 9B_1, 9B_2 and 9B_3 that the first and second sensing electrodes 410 and 420 are included in a same one of the second conductive layer CML2, the present disclosure is not limited thereto. In another embodiment, the first sensing electrode 410 and the second sensing electrode 420 may be arranged in different layers from each other. In an embodiment, for example, one of the first sensing electrode 410 and the second sensing electrode 420 may be disposed or formed in the first conductive layer CML1, and the other may be disposed or formed in the second conductive layer CML2.

Figure 10:
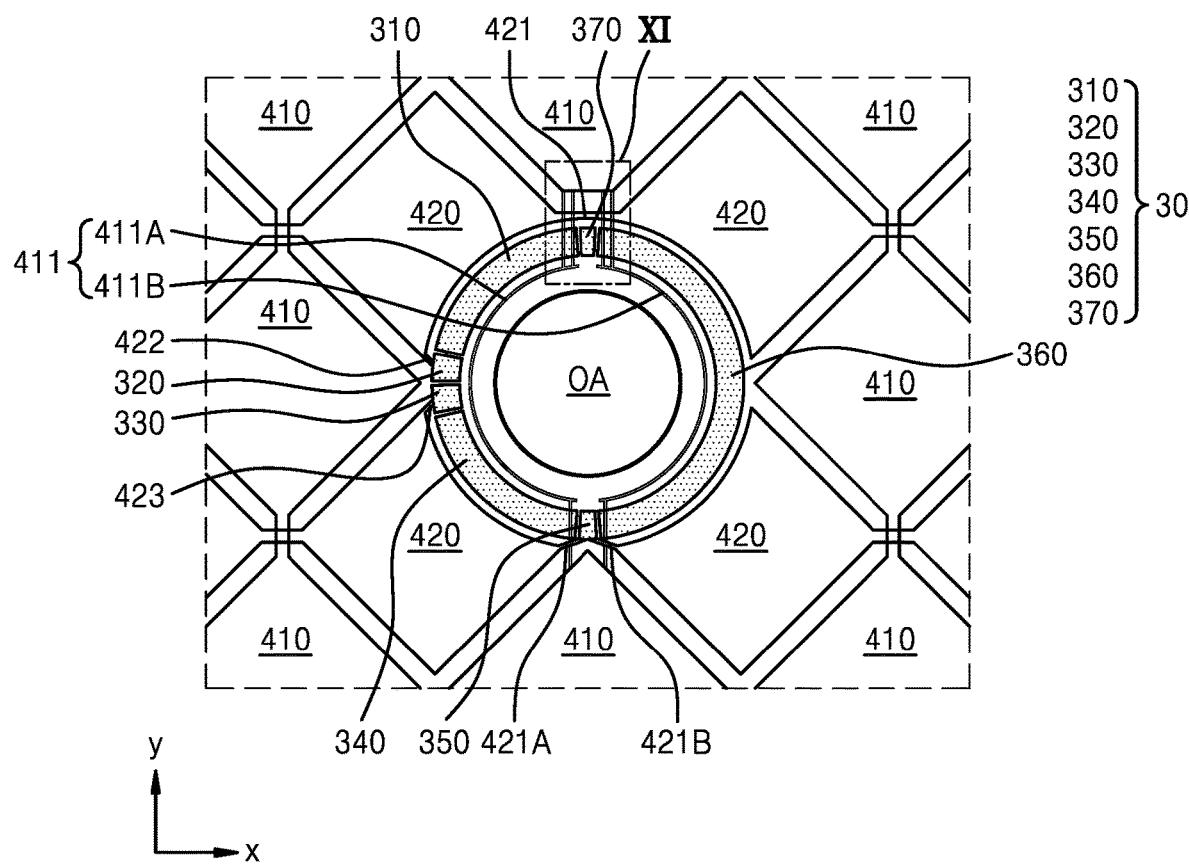
FIG. 10 is an enlarged top plan view an embodiment of an opening and area adjacent thereto of a display device.
Figure 11:
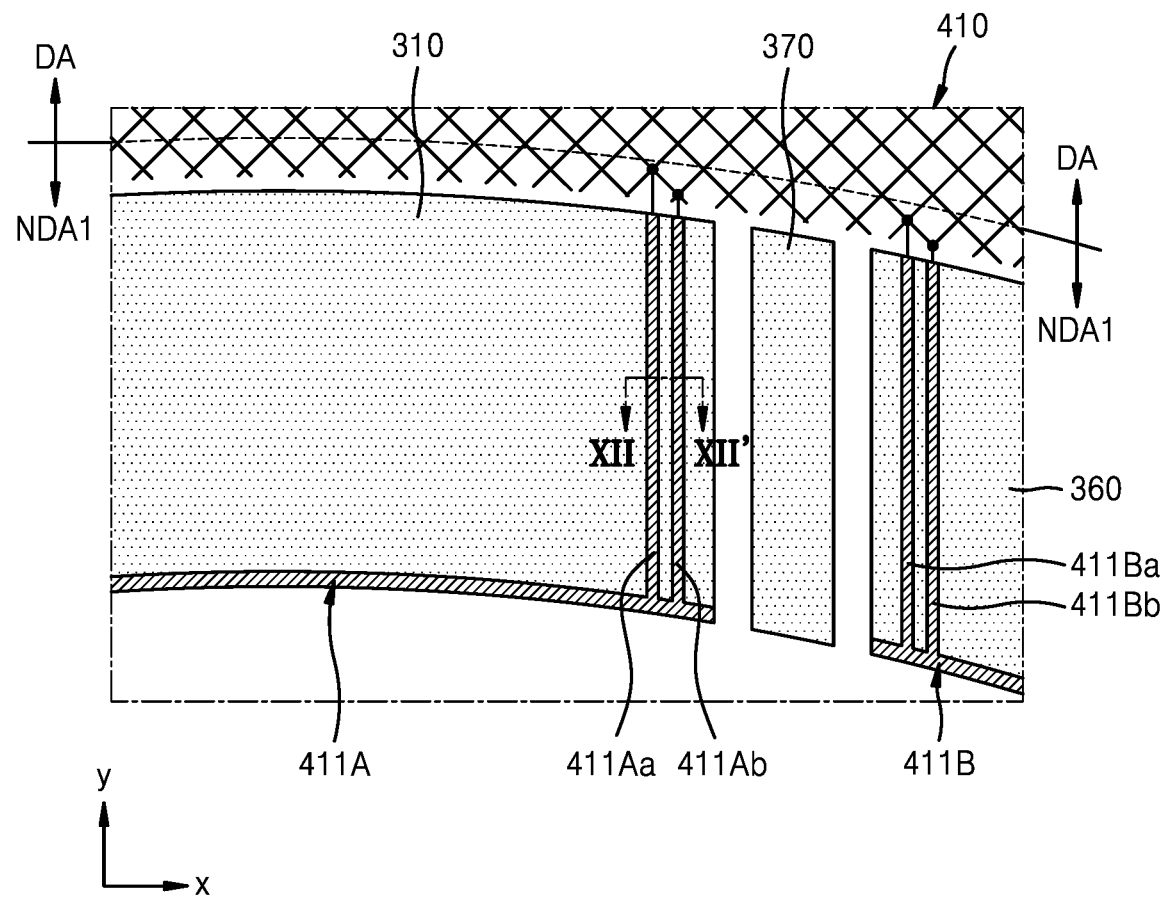
FIG. 11 is an enlarged top plan view of an embodiment of region XI of FIG. 10.
Figure 12:
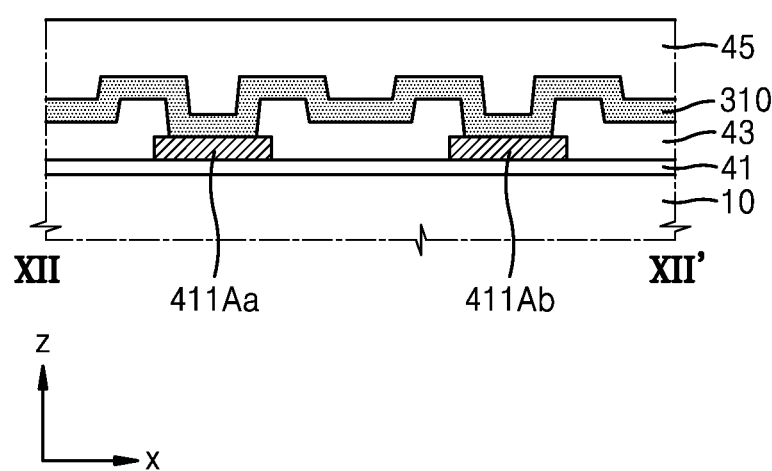
FIG. 12 is a cross-sectional view taken along line XII-XII' of FIG. 11.

FIG. 10 is an enlarged top plan view of an embodiment of an opening of the display device 1 and area adjacent thereto, FIG. 11 is an enlarged top plan view of region XI of FIG. 10, and FIG. 12 is a cross-sectional view taken along line XII-XII' of FIG. 11.

Referring to FIG. 10, the metal layer 30 may include the first to seventh segments 310, 320, 330, 340, 350, 360, and 370. The first to seventh segments 310, 320, 330, 340, 350, 360, and 370 may be spaced apart from each other with a predetermined interval to surround the opening area OA. As described above, the metal layer 30 may be located in the same layer in which one of the first and second conductive layers CML1 and CML2 of the input sensing layer 40 (see FIG. 8) is arranged and may include the same material as that of one of the first and second conductive layers CML1 and CML2. Hereinafter, for convenience of description, description is made to the case where the metal layer 30 is located in the same layer in which the second conductive layer CML2 is arranged and includes the same material as that of the second conductive layer CML2.

The first sensing electrodes 410 may be spaced apart from each other with respect to the opening area OA. The second sensing electrodes 420 may be spaced apart from each other with respect to the opening area OA. Neighboring first sensing electrodes 410 and/or neighboring second sensing electrodes 420 respectively arranged around the opening area OA may be electrically connected to each other by a connection electrode and/or the segments of the metal layer 30. In this regard, FIG. 10 describes that neighboring first sensing electrodes 410 spaced apart from each other around the opening area OA may be electrically connected to each other by the first connection electrode 411. Neighboring second sensing electrodes 420 spaced apart from each other around the opening area OA may be electrically connected to each other by the second connection electrode 421 and/or one of the segments of the metal layer 30.

In an embodiment, for example, as shown in FIG. 10, neighboring first sensing electrodes 410 that are arranged along the y-direction around the opening area OA may be electrically connected to each other by first sub-connection electrodes 411A and 411B. The first sub-connection electrodes 411A and 411B are elements or extensions of the first connection electrodes 411 and may be included in the first conductive layer CML1 as described with reference to FIGS. 8 and 9A.

Neighboring second sensing electrodes 420 that are arranged on the upper right side and the upper left side of the opening area OA may be electrically connected by the second connection electrode 421. The second sensing electrodes 420 and the second connection electrode 421 may be included in the second conductive layer CML2 as described above.

Neighboring second sensing electrodes 420 that are arranged on the lower right side and the lower left side of the opening area OA may be electrically connected by second sub-connection electrodes 421A and 421B and the fifth segment 350. In an embodiment, for example, the second sub-connection electrodes 421A and 421B and the fifth segment 350 may be arranged in the second conductive layer CML2. That is, the second sensing electrodes 420, the second sub-connection electrodes 421A and 421B and the fifth segment 350 may be located in the same layer, may include the same material, and may be connected to each other as one body. As being 'one body,' one among the second sensing electrodes 420, the second sub-connection electrodes 421A and 421B and the fifth segment 350 may extend to define a portion thereof as another one among the second sensing electrodes 420, the second sub-connection electrodes 421A and 421B and the fifth segment 350.

At least one of the first to seventh segments 310, 320, 330, 340, 350, 360, or 370 may be electrically connected to the first sensing electrode 410 or the second sensing electrode 420. With regards to this, FIG. 10 shows that each of the first to sixth segments 310 to 360 is connected to the first sensing electrode 410 or the second sensing electrode 420.

As shown in FIGS. 10, 11 and 12, the first segment 310 may overlap one of the first sub-connection electrodes 411A and may be electrically connected to the first sub-connection electrodes 411A. Referring to FIG. 11, the first segment 310 may overlap first and second portions 411Aa and 411Ab of the first sub-connection electrodes 411A. Referring to FIG. 12, the first segment 310 located in the same layer in which the second conductive layer CML2 (see FIG. 8) is arranged may contact the first sub-connection electrode 411A located in the same layer in which the first conductive layer CM1 (see FIG. 8) is arranged through a contact hole disposed or formed in the second insulating layer 43. The first segment 310 that is electrically connected to the first sub-connection electrode 411A that connects the first sensing electrodes 410 to each other may form a portion of or function as the first sensing electrode 410.

The second segment 320 may be electrically connected to one of the second sensing electrodes 420 by a connection portion 422. In an embodiment, for example, as shown in FIG. 10, the second sensing electrode 420 on the upper left side of the opening area OA, the connection portion 422, and the second segment 320 may be located in the same layer in which the second conductive layer CML2 (see FIG. 8) is arranged and may be formed as one body. The second segment 320 may form a portion of or function as the second sensing electrode 420.

The third segment 330 may be electrically connected to one of the second sensing electrodes 420 by another connection portion 423. In an embodiment, for example, as shown in FIG. 10, the second sensing electrode 420 on the lower left side of the opening area OA, the other connection portion 423, and the third segment 330 may be located in the same layer in which the second conductive layer CML2 (see FIG. 8) is arranged and may be formed as one body. The third segment 330 may form a portion of or function as the second sensing electrode 420.

Similar to the first segment 310 at the upper portion of the opening area OA, the fourth segment 340 at the lower portion of the opening area OA may be electrically connected to the first sub-connection electrode 411A. The electrical connection between the fourth segment 340 and the first sub-connection electrode 411A has the same structure as that described with reference to FIG. 12. Similar to the first segment 310, the fourth segment 340 may form a portion of or function as the first sensing electrode 410.

The fifth segment 350 may be connected to each of neighboring second sensing electrodes 420 by the second sub-connection electrodes 421A and 421B. In an embodiment, for example, as shown in FIG. 10, the fifth segment 350 may be connected to the second sensing electrode 420 on the lower left side of the opening area OA by one second sub-connection electrode 421A and may be connected to the second sensing electrode 420 on the lower right side of the opening area OA by the other second sub-connection electrode 421B. The second sensing electrodes 420, the second sub-connection electrodes 421A and 421B, and the fifth segment 350 may be disposed or formed in the same layer as each other, for example, in the same layer in which the second conductive layer CML2 (see FIG. 8) is arranged. The fifth segment 350 may form a portion of or function as the second sensing electrode 420 or the second connection electrode 421.

As shown in FIGS. 10 and 11, the sixth segment 360 may overlap the other first sub-connection electrode 411B and may be electrically connected to the first sub-connection electrode 411B. Referring to FIG. 11, the sixth segment 360 may overlap first and second portions 411Ba and 411Bb of the first sub-connection electrode 411B. Similar to the description made above with reference to FIG. 11, the sixth segment 360 may contact the first and second portions 411Ba and 411Bb of the first sub-connection electrode 411B through a contact hole disposed or formed in the second insulating layer 43 (see FIG. 12). The sixth segment 360 connected to the first sub-connection electrode 411B may form a portion of or function as the first sensing electrode 410.

The seventh segment 370 may include a floating electrode. In an embodiment, for example, the seventh segment 370 may include a floating electrode that is not electrically connected to the first sensing electrode 410 or the second sensing electrode 420.

FIG. 11 shows a portion of the first, sixth, and seventh segments 310, 360, and 370 arranged in the first non-display area NDA1. The first sensing electrode 410 having a grid/mesh/lattice structure defined by conductive lines is shown in detail within the display area DA adjacent to the non-display area NDA1. As shown in FIG. 11, a portion of the first sensing electrode 410 of the display area DA may extend into the first non-display area NDA1 to be located in the first non-display area NDA1.

Though FIG. 10 shows that planar areas of one first sensing electrode 410 (upper central) and four second sensing electrodes 420 (closest to the opening area OA) are different from planar areas of other sensing electrodes due to the opening area OA, the present disclosure is not limited thereto. The arrangement of the first and second sensing electrodes 410 and 420 around the opening area OA may be variously modified and the planar areas of the first and second sensing electrodes 410 and 420 may be also variously modified depending on the location and/or the size of the opening area OA. A touch sensitivity or sensing sensitivity in the vicinity of the opening area OA may be remarkably reduced depending on a location and/or size of the opening area OA. In the case where one or more of the first to seventh segments 310, 320, 330, 340, 350, 360, or 370 of the metal layer 30 are connected to the first sensing electrode 410 or the second sensing electrode 420 as described above, the segment(s) may serve as a sensing electrode and improve the touch sensitivity in the vicinity of the opening area OA.

Though FIG. 10 shows that the planar areas (or planar sizes) of the first to seventh segments 310, 320, 330, 340, 350, 360, and 370 are different, the present disclosure is not limited thereto. In another embodiment, the planar areas (or sizes) of the first to seventh segments 310, 320, 330, 340, 350, 360, and 370 may be the same. The planar areas (or sizes) of the first to seventh segments 310, 320, 330, 340, 350, 360, and 370 may be determined depending on the location and/or size of the opening area OA. The number of segments of the metal layer 30 may be variously modified depending on the location and/or dimensions of the opening area OA.

Though FIG. 10 shows that the first, fourth, and sixth segments 310, 340, and 360 connected to a first sensing electrode 410 or a second sensing electrodes 420 respectively neighboring to the segment, the present disclosure is not limited thereto. In another embodiment, the electric connection and arrangement of the segments may be variously modified as described below with reference to FIGS. 13A and 13B.

Figure 13A:
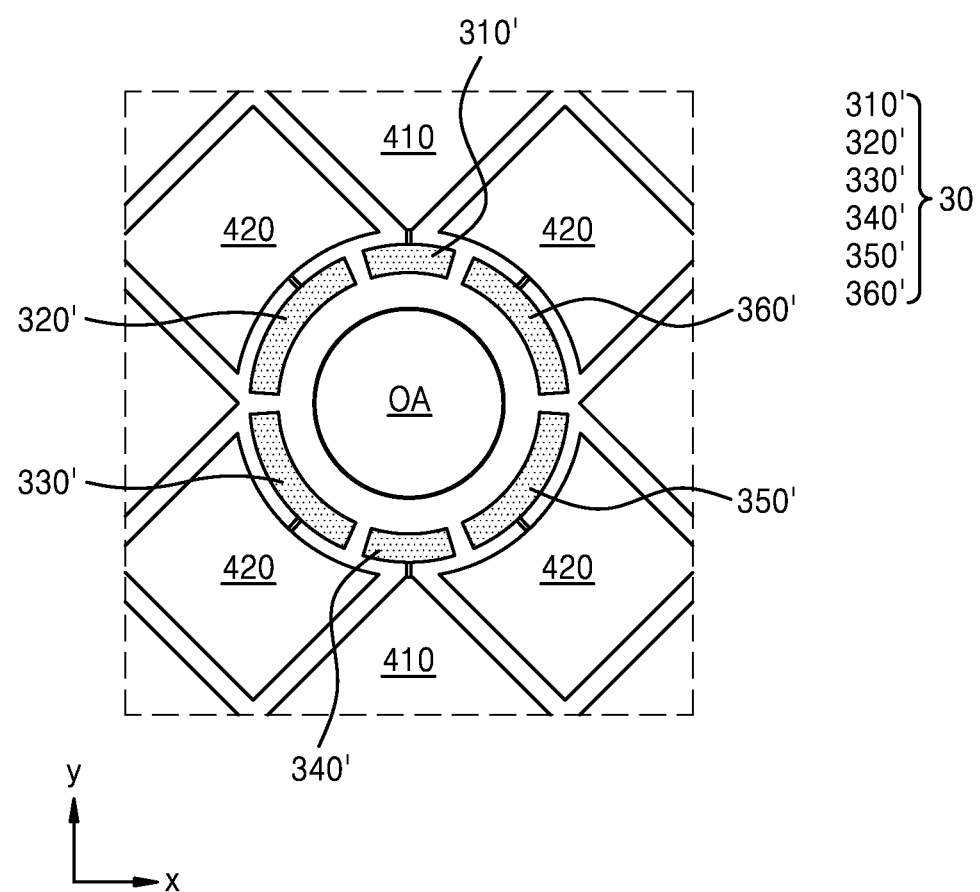
FIGS. 13A and 13B are enlarged top plan views of modified embodiments of a metal layer and sensing electrodes of a display device.
Figure 13B:
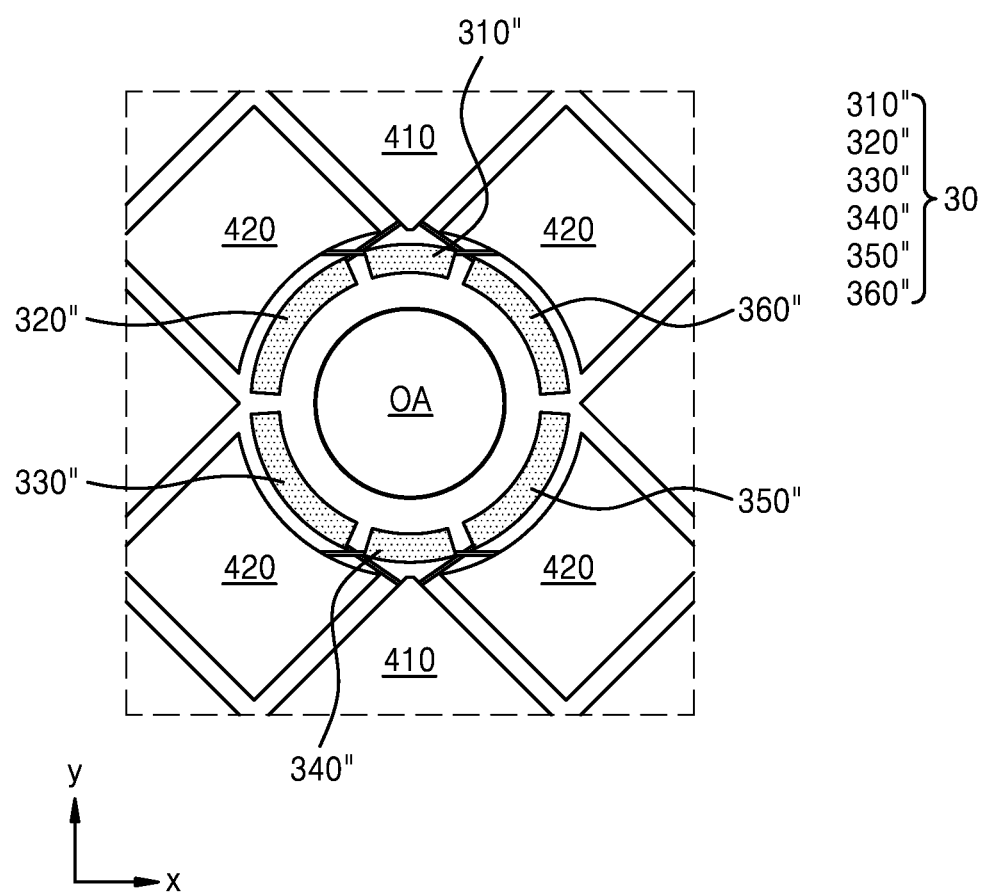

FIGS. 13A and 13B are enlarged top plan views of modified embodiments of the metal layer 30 and sensing electrodes of the display device 1. FIGS. 13A and 13B show that the metal layer 30 includes six segments.

Referring to FIG. 13A, each of first to sixth segments 310', 320', 330', 340', 350', and 360' may be electrically connected to a neighboring sensing electrode. In an embodiment, for example, each of the first and fourth segments 310' and 340' may be respectively electrically connected to a neighboring first sensing electrode 410. Each of the second, third, fifth, and sixth segments 320', 330', 350', and 360' may be respectively electrically connected to a neighboring second sensing electrode 420. That is, a segment arranged between the opening area OA and one of the sensing electrodes may receive the same voltage as that of the corresponding neighboring sensing electrode.

Referring to FIG. 13B, each of first to sixth segments 310", 320", 330", 340", 350", and 360" may be electrically connected to a sensing electrode to which a different voltage from that of a neighboring (e.g., closest) sensing electrode is applied. In an embodiment, for example, each of the first and fourth segments 310" and 340" may be electrically connected to a second sensing electrode 420. Each of the first and fourth segments 310" and 340" may be electrically connected to two second sensing electrodes 420. Each of the second, third, fifth, and sixth segments 320", 330", 350", and 360" may be electrically connected to the first sensing electrode 410. Two segments among the second, third, fifth, and sixth segments 320", 330", 350", and 360" may be connected to a same one of the first sensing electrode 410. That is, a segment arranged between the opening area OA and one of the sensing electrodes may receive a different voltage from that of the neighboring (e.g., closest) sensing electrode.

As shown in FIGS. 13A and 13B, planar areas and sizes of sensing electrodes that neighbor the opening area OA to be disposed closest thereto among the sensing electrodes may be different. In an embodiment, for example, a planar area or size of the second sensing electrode 420 may be greater than a planar area or size of the first sensing electrode

410. FIGS. 13A and 13B show that a planar area or size of a segment that neighbors a sensing electrode having a relatively small area among the sensing electrodes around the opening area OA is greater than an area or size of a segment that neighbors a sensing electrode having a relatively large area among the sensing electrodes around the opening area OA. In an embodiment, for example, a planar area or size of the second segments 320' and 320" that neighbor the (upper left) second sensing electrode 420 having a relatively small planar area or size among all of the sensing electrodes may be greater than a planar area or size of the first segments 310' and 310" that neighbor the (upper central) first sensing electrode 410 having a relatively large planar area or size among all of the sensing electrodes. The relatively small planar area may correspond to a sensing electrode having a reduced planar area due to modifying an original shape of the sensing electrode to define an edge thereof corresponding to the edge of the opening area OA. Conversely, the relatively large planar area may correspond to a sensing electrode for which an original shape (refer to FIG. 7 or 9B_1) is not modified and is maintained even though such sensing electrode is a 'neighboring' sensing electrode relative to the metal layer 30. However, the present disclosure is not limited thereto. In another embodiment, a planar area or size of the second segment that neighbors the second sensing electrode 420 having the relatively small planar area or size may be less than a planar area or size of the first segment that neighbors the first sensing electrode 410 having the relatively large area or size.

Though not separately shown in FIGS. 13A and 13B, the sensing electrodes spaced apart from each other around the opening area OA may be connected to each other to constitute a row (e.g., extended along the x-direction) or a column (e.g., extended along the y-direction). In an embodiment, for example, the first sensing electrodes 410 above and below the opening area OA along the y-direction may be connected to each other by the first sub-connection electrodes 411A and 411B described above with reference to FIG. 10. Likewise, the second sensing electrodes 420 on the lower right side and the lower left side of the opening area OA may be connected to each other by the second sub-connection electrodes 421A and 421B described with reference to FIG. 10, and the second sensing electrodes 420 on the upper right side and the upper left side of the opening area OA may be also connected to each other by a sub-connection electrode (not shown) similar to the second sub-connection electrodes 421A and 421B. Since sensing electrodes disposed along a respective row or column may be at opposing sides of the opening area OA, since the sensing electrodes at the opposing sides are connected to each by sub-connection electrodes, the touch sensitivity in the vicinity of the opening area OA may be further improved.

Figure 14:
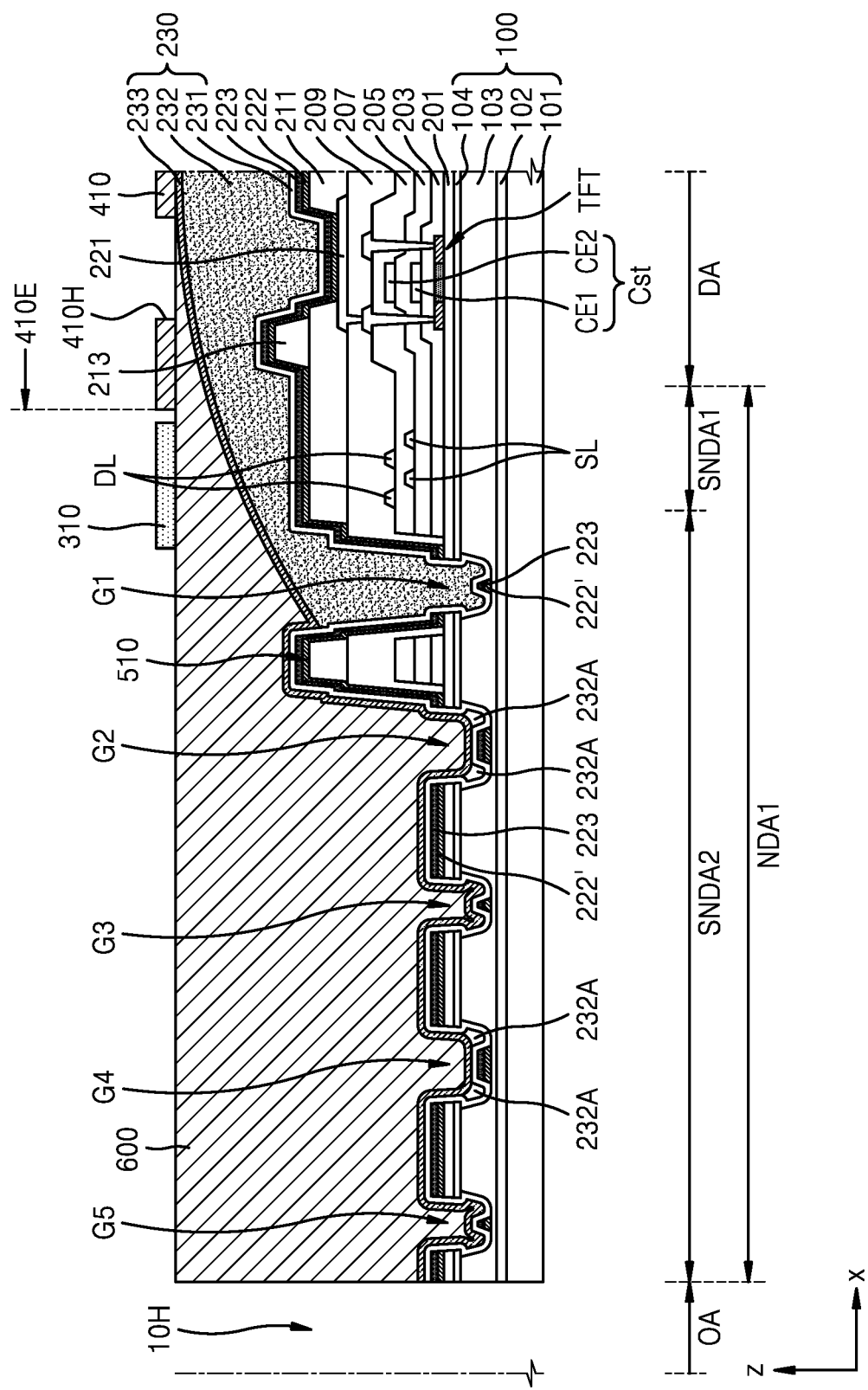
FIG. 14 is a cross-sectional view of an embodiment of a display device.

FIG. 14 is a cross-sectional view of an embodiment of the display device 1.

First, the display area DA of FIG. 14 is described.

The substrate 100 may include a polymer resin. The substrate 100 may include a plurality of layers. In an embodiment, for example, the substrate 100 may include a base layer including a polymer resin, and an inorganic layer. In an embodiment, for example, the substrate 100 may include a first base layer 101, a first inorganic layer 102, a second base layer 103, and a second inorganic layer 104 that are sequentially stacked.

Each of the first and second base layers 101 and 103 may include a polymer resin. In an embodiment, for example, the first and second base layers 101 and 103 may include a polymer resin such as polyethersulfone ("PES"), polyarylate ("PAR"), polyetherimide ("PEI"), polyethylene naphthalate ("PEN"), polyethylene terephthalate ("PET"), polyphenylene sulfide ("PPS"), polyimide ("PI"), polycarbonate ("PC"), cellulose triacetate ("TAC"), and cellulose acetate propionate ("CAP"). The polymer resin may be transparent.

Each of the first and second inorganic layers 102 and 104 may include a barrier layer configured to reduce or effectively prevent penetration of external foreign substances and include a single layer structure or a multi-layer structure including an inorganic material such as SiNx and/or SiOx.

A buffer layer 201 configured to reduce or effectively prevent impurities from penetrating into a semiconductor layer of a thin film transistor may be arranged on the substrate 100. Referring to FIG. 14, the buffer layer 201 may be arranged on the semiconductor layer of a thin film transistor TFT. The buffer layer 201 may include an inorganic insulating material such as silicon nitride or silicon oxide and may include a single layer structure or a multi-layer structure. In an embodiment, the second inorganic layer 104 of the substrate 100 may be understood as a portion of the buffer layer 201, which is a multi-layer structure.

A pixel circuit (refer to PC in FIG. 4, for example) including the thin film transistor TFT and a storage capacitor Cst may be arranged on the buffer layer 201.

The storage capacitor Cst includes a lower electrode CE1 and an upper electrode CE2 that overlap each other with a first interlayer insulating layer 205 therebetween. The storage capacitor Cst may overlap the thin film transistor TFT. With regard to this, FIG. 14 shows a gate electrode of the thin film transistor TFT serves as the lower electrode CE1 of the storage capacitor Cst. In another embodiment, the storage capacitor Cst may not overlap the thin film transistor TFT. The storage capacitor Cst may be covered by a second interlayer insulating layer 207. A gate insulating layer 203 may be disposed between the lower electrode CE1 and the semiconductor layer of the thin film transistor TFT The first and second interlayer insulating layers 205 and 207 may include an inorganic insulating layer such as silicon oxide, silicon nitride, silicon oxynitride, aluminum oxide, titanium oxide, tantalum oxide, and hafnium oxide. The first and second interlayer insulating layers 205 and 207 may include a single layer structure or a multi-layer structure including the above-mentioned materials.

The pixel circuit including the thin film transistor TFT and the storage capacitor Cst is covered by an organic insulating layer 209. The organic insulating layer 209 may include a planarization insulating layer. The organic insulating layer 209 may include an organic insulating material including an imide-based polymer, a general-purpose polymer such as, polymethylmethacrylate ("PMMA") and polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the organic insulating layer 209 may include polyimide.

A display element, for example, an organic light-emitting diode is arranged on the organic insulating layer 209. A pixel electrode 221 of the organic light-emitting diode may be arranged on the organic insulating layer 209 and may be connected to the pixel circuit through a contact hole in the organic insulating layer 209.

The pixel electrode 221 may include a conductive oxide material such as indium tin oxide ("ITO"), zinc oxide ("IZO"), zinc oxide (ZnO), indium oxide ($In_2O_3$), indium gallium oxide (IGO), or aluminum zinc oxide (AZO). In another embodiment, the pixel electrode 221 may include a reflective material layer including Ag, Mg, Al, Pt, Pd, Au, Ni, Nd, Ir, Cr, and/or a compound thereof. In another embodiment, the pixel electrode 221 may further include a layer including ITO, IZO, ZnO, or $In_2O_3$ on/under the reflective layer.

A pixel-defining layer 211 includes an opening at which a top surface of the pixel electrode 221 is exposed and covers an edge of the pixel electrode 221. The pixel-defining layer 211 may include an organic insulating material. Alternatively, the pixel-defining layer 211 may include an inorganic insulating material or include an organic and inorganic insulating material.

An intermediate layer 222 includes an emission layer. The emission layer may include a polymer or relatively low molecular organic material that emits light of a predetermined color. In an embodiment, the intermediate layer 222 may include a first functional layer under the emission layer and/or a second functional layer over the emission layer.

The first functional layer may include a single layer structure or a multi-layer structure. In an embodiment, for example, in the case where the first functional layer includes a polymer material, the first functional layer includes a hole transport layer ("HTL"), which has a single-layered structure, and may include poly-(3,4)-ethylene-dihydroxy thiophene ("PEDOT") or polyaniline ("PANI"). In the case where the first functional layer includes a relatively low molecular material, the first functional layer may include a hole injection layer ("HIL") and an HTL.

The second functional layer may be omitted. In an embodiment, for example, in the case where the first functional layer and the emission layer include a polymer material, the second functional layer may be provided to improve the organic light-emitting diode. The second functional layer may be a single layer structure or a multi-layer structure. The second functional layer may include an electron transport layer ("ETL") and/or an electron injection layer ("EIL").

Some of the layers constituting the intermediate layer 222, for example, the functional layers may be arranged in not only the display area DA but also the first non-display area NDA1. Portions of the overall layers arranged in both the display area DA and the first non-display area NDA1 are disconnected from each other at the first non-display area NDA1 by the first to fifth grooves G1, G2, G3, G4, and G5 described below.

An opposite electrode 223 is arranged to face the pixel electrode 221 with the intermediate layer 222 therebetween. The opposite electrode 223 may include a conductive material having a relatively low work function. In an embodiment, for example, the opposite electrode 223 may include a (semi) transparent layer including Ag, Mg, Al, Pt, Pd, Au, Ni, Nd, Ir, Cr, Li, Ca, and/or an ally thereof. Alternatively, the opposite electrode 223 may further include a layer including ITO, IZO, ZnO, or $In_2O_3$ on the (semi) transparent layer including the above-mentioned material.

The display element may be covered by a thin-film encapsulation layer 230 and protected by external foreign substances or moisture. The thin-film encapsulation layer 230 is arranged on the opposite electrode 223. The thin-film encapsulation layer 230 may include at least one organic encapsulation layer and at least one inorganic encapsulation layer. FIG. 14 shows that the thin-film encapsulation layer 230 includes first and second inorganic encapsulation layers 231 and 233 and an organic encapsulation layer 232 which is arranged therebetween. In another embodiment, the number of and a stacked sequence of organic encapsulation layers and inorganic encapsulation layers within the thin-film encapsulation layer 230 may change.

The first and second inorganic encapsulation layers 231 and 233 may include one or more inorganic insulating materials including aluminum oxide, titanium oxide, tantalum oxide, hafnium oxide, zinc oxide, silicon oxide, silicon nitride, and/or silicon oxynitride. In an embodiment of manufacturing a display device, the first and second inorganic encapsulation layers 231 and 233 may be formed by chemical vapor deposition ("CVD"). The organic encapsulation layer 232 may include a polymer-based material. The polymer-based material may include acrylic-based resin, epoxy-based resin, polyimide, and polyethylene.

The input sensing layer (refer to 40 in FIG. 2) is arranged on the thin-film encapsulation layer 230. With regard to this, among elements of the input sensing layer FIG. 14 shows the first sensing electrode 410 arranged on the thin-film encapsulation layer 230. As described above with reference to FIGS. 9B_1, 9B_2 and 9B_3, the first sensing electrode 410 includes a hole 410H corresponding to the emission area P-E of a pixel. The organic light-emitting diode described for FIG. 14 may correspond to the emission area P-E of the pixel. As described above with reference to FIG. 11, an end 410E of the first sensing electrode 410 over the organic light-emitting diode that neighbors the opening area OA may extend to the first non-display area NDA1. The end 410E of the first sensing electrode 410 may terminate at the first non-display area NDA1 without being limited thereto. Though the FIG. 14 shows the first sensing electrode 410 for convenience of illustration, the present disclosure is not limited thereto. The second sensing electrode and/or first and second connection electrodes may also be located in the display area DA.

The first non-display area NDA1 of FIG. 14 is described.

Referring to the first non-display area NDA1 of FIG. 14, the first non-display area NDA1 may include a first sub non-display area SNDA1 and a second sub non-display area SNDA2 that is disposed closer to the opening area OA than the first sub non-display area SNDA1.

The first sub non-display area SNDA1 is an area across which signal lines pass. As signal lines, the data lines DL and the scan lines SL of the first sub non-display area SNDA1 in FIG. 14 may correspond to the data lines that detour around the opening area OA described with reference to FIG. 5. The first sub non-display area SNDA1 may be a wiring area or a detour area across which signal lines pass. Signal lines may not be disposed in the second sub non-display area SNDA2.

The second sub non-display area SNDA2 is an overall groove area in which grooves are arranged. FIG. 14 shows the first to fifth grooves G1, G2, G3, G4, and G5 arranged in the second sub non-display area SNDA2. Each of the first to fifth grooves G1, G2, G3, G4, and G5 may have an undercut structure. The first to fifth grooves G1, G2, G3, G4, and G5 may be defined or formed in a multi-layer structure including an inorganic layer and an organic layer. In an embodiment, for example, the first to third grooves G1, G2, and G3 may be formed by removing a portion of multiple layers within the substrate 100 including a plurality of layers.

In an embodiment of manufacturing a display device, each of the first to fifth grooves G1, G2, G3, G4, and G5 may be formed by etching the second base layer 103 of the substrate 100 and the second inorganic layer 104 thereon. With regard to this, FIG. 14 shows that the first to fifth grooves G1, G2, G3, G4, and G5 are formed by removing a portion of the second base layer 103 and a portion of the second inorganic layer 104. FIG. 14 shows that the buffer layer 201 on the second inorganic layer 104 is simultaneously removed with the second inorganic layer 104. Though the buffer layer 201 and the second inorganic layer 104 have different names with reference to FIG. 14, the buffer layer 201 may be understood as one of the layers included in the second inorganic layer 104 which is a multi-layer structure, or the second inorganic layer 104 may be understood as one of the layers included in the buffer layer 201, which is a multi-layer structure.

Each of the first to fifth grooves G1, G2, G3, G4, and G5 may have an undercut structure in which a width along the x-direction of a portion thereof that passes through the second base layer 103 is greater than a width along the x-direction of a portion thereof that passes through the second inorganic layer 104 and/or the buffer layer 201. Through the undercut structure of the first to fifth grooves G1, G2, G3, G4, and G5, a portion 222' (e.g., the first and/or second functional layers) of the intermediate layer 222 and the opposite electrode 223 may be disconnected from other portions thereof. With regard to this, it is shown that each of the portion 222' of the intermediate layer 222 and the opposite electrode 223 within the first to fifth grooves G1, G2, G3, G4, and G5 is disconnected (or separated) from other portions of the intermediate layer 222 and the opposite electrode 223 around the first to fifth grooves G1, G2, G3, G4, and G5.

The first inorganic encapsulation layer 231 of the thin-film encapsulation layer 230 may cover an inner surface of the first to fifth grooves G1, G2, G3, G4, and G5. The organic encapsulation layer 232 may cover the first groove G1 and at least partially fill the first groove G1 on the first inorganic encapsulation layer 231.

In an embodiment of manufacturing a display device, the organic encapsulation layer 232 may be formed by coating a monomer material over the substrate 100 and hardening the monomer. To control a flow of the monomer material and secure a thickness of the monomer material (or the organic encapsulation layer 232), a partition wall 510 may be provided between the first and second grooves G1 and G2. The partition wall 510 may include an organic insulating material.

In an embodiment, during a process of forming the organic encapsulation layer 232, a portion of the material for forming the organic encapsulation layer 232 may remain in some of the grooves. With regard to this, FIG. 14 shows that there is an organic material 232A in the second and fourth grooves G2 and G4.

The second inorganic encapsulation layer 233 may be arranged on the organic encapsulation layer 232 and may directly contact the first inorganic encapsulation layer 231 at the second to fifth grooves G2, G3, G4, and G5.

A planarization layer 600 may be located in the second sub non-display area SNDA2 to cover at least one groove. In an embodiment, for example, the planarization layer 600 may commonly cover the first to fifth grooves G1, G2, G3, G4, and G5. The planarization layer 600 may cover the second to fifth grooves G2, G3, G4, and G5 and at least partially fill at least one of the second to fifth grooves G2, G3, G4, or G5. As shown in FIG. 14, spaces of the second to fifth grooves G2, G3, G4, and G5 on the second inorganic encapsulation layer 233 may be filled with the planarization layer 600.

The planarization layer 600 may increase flatness of the display panel 10 around the opening area OA by covering an area of the second sub non-display area SNDA2 that is not covered by the organic encapsulation layer 232. The planarization layer 600 may include an organic insulating material. When elements such as a reflection prevention member and/or a window are arranged on the display panel 10 (refer to 50 and 60 in FIG. 2), the planarization layer 600 may reduce or effectively prevent separation or floating of those elements from the display panel 10, or improper coupling of those elements to the display panel 10.

The planarization layer 600 may extend from the second sub non-display area SNDA2 to be disposed on the thin-film encapsulation layer 230 and may be spatially separated from the organic encapsulation layer 232 by the second inorganic encapsulation layer 233. In an embodiment, for example, since the planarization layer 600 is arranged on the second inorganic encapsulation layer 233, and the organic encapsulation layer 232 is arranged under the second inorganic encapsulation layer 233, the organic encapsulation layer 232 and the planarization layer 600 may be spatially separated from each other. The organic encapsulation layer 232 and the planarization layer 600 may not directly contact each other. The planarization layer 600 may have a thickness of about 5 micrometers (μm) or more.

The metal layer 30 (see FIG. 11) may be arranged on the planarization layer 600. With regard to this, FIG. 14 shows the first segment 310 which is a portion of the metal layer 30. The first segment 310, that is, the metal layer 30 may cover signal lines (e.g. the data line DL and the scan line SL) arranged in the first non-display area NDA1.

As described above with reference to FIG. 6, a radial width of the metal layer 30, for example, the first segment 310 may be less than a radial width of the first non-display area NDA1. Though FIG. 14 shows that the metal layer 30, for example, the first segment 310 does not overlap the first to fifth grooves G1, G2, G3, G4, and G5, the present disclosure is not limited thereto. In another embodiment, the metal layer 30, for example, the first segment 310 may overlap and cover at least one groove.

Figure 15:
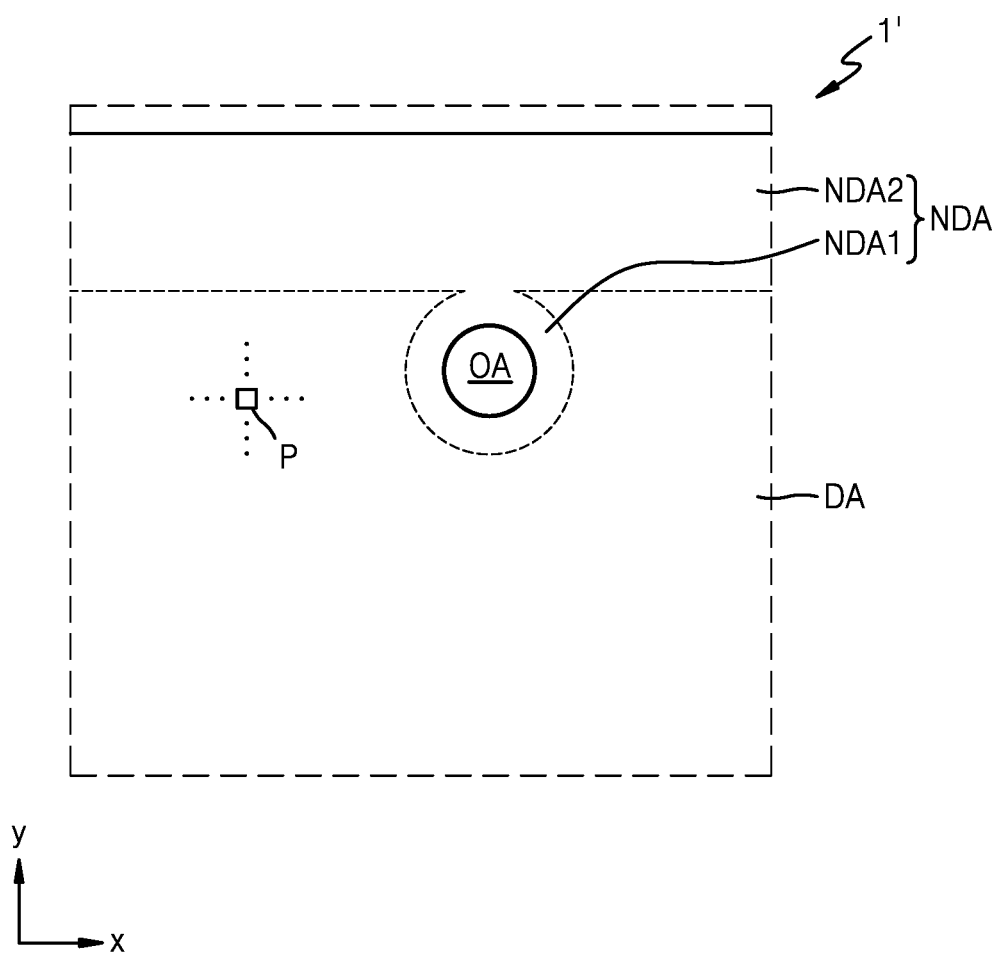
FIG. 15 is an enlarged top plan view of an embodiment of a portion of a display device.
Figure 16:
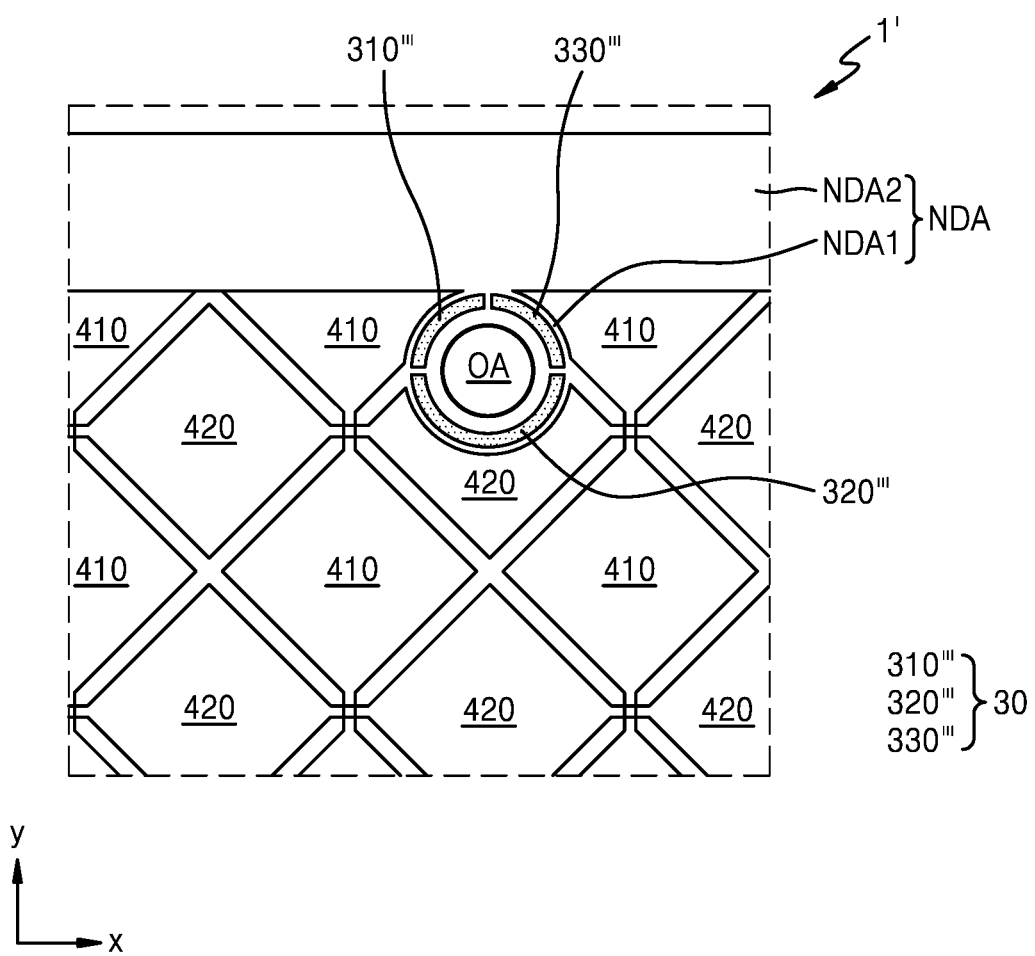
FIG. 16 is an enlarged top plan view of an embodiment of a metal layer and an input sensing layer of the display device of FIG. 15.

FIG. 15 is an enlarged top plan view of another embodiment of a portion of a display device 1' and FIG. 16 is an enlarged top plan view of the metal layer 30 and the input sensing layer 40 of the display device 1' of FIG. 15.

Though the display device 1 described with reference to FIG. 3 has described that the opening area OA is entirely surrounded by the display area DA, the present disclosure is not limited thereto. As shown in FIG. 15, in a display device 1', the opening area OA may be partially surrounded by the display area DA. In this case, the first non-display area NDA1 that surrounds the opening area OA may be connected to the second non-display area NDA2 that extends along an edge of the substrate 100.

Referring to FIG. 16, the metal layer 30 is arranged in the first non-display area NDA1 that surrounds the opening area OA. The metal layer 30 may include a plurality of segments. In an embodiment, for example, as shown in FIG. 16, first to third segments 310", 320", and 330" are shown. The metal layer 30 shown in FIG. 16 may have the same structure and/or features as those of the embodiment described above with reference to FIGS. 6 to 14 with only differences in the number of segments.

In one or more embodiment, the metal layer 30 may reduce or effectively prevent a wiring that neighbors the opening area OA or the opening from being unexpectedly externally viewed. The metal layer 30 that neighbors the opening area OA or the opening may also reduce or effectively prevent reduction of a touch sensitivity at the opening area OA or in the vicinity of the opening.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A display device comprising:
   a substrate including:
   a first area in which an opening in the substrate is defined, wherein a shape of the opening defines an outer edge of the first area,
   a second area including a display element on the substrate and with which an image is displayed, and
   a third area between the first area and the second area:
   a signal wiring connected to the display element, a portion of the signal wiring being in the third area and extended along the outer edge of the first area, and
   a metal layer being in the third area, the metal layer including a plurality of segments arranged along the outer edge of the first area and spaced apart from each other with a gap,
   wherein the portion of the signal wiring extends across the gap.

2. The display device of claim 1, wherein the metal layer includes a metal having a light-blocking characteristic.

3. The display device of claim 1, wherein the signal wiring extended along the outer edge of the first area is between the metal layer and the substrate.

4. The display device of claim 3, wherein the signal wiring comprises a scan signal line or a data signal line connected to the display element,
   wherein
   the scan signal line or the data signal line extends from the second area to dispose a portion of the scan signal line or the data signal line in the third area.

5. The display device of claim 1, further comprising in the second area including the display element, an input sensing layer on the display element, the input sensing layer including:
   first sensing electrodes arranged along a first direction, and
   second sensing electrodes arranged along a second direction which intersects with the first direction.

6. The display device of claim 5, wherein
   the metal layer and the first sensing electrodes are respectively portions of a same material layer, or
   the metal layer and the second sensing electrodes are respectively portions of a same material layer.

7. The display device of claim 5, wherein the plurality of segments of the metal layer include:
   a first segment electrically connected to one of the first sensing electrodes; and
   a second segment electrically connected to one of the second sensing electrodes.

8. The display device of claim 7, wherein the first segment of the metal layer is closer to the first sensing electrode than the second sensing electrode.

9. The display device of claim 1, wherein the portion of the signal wiring is overlapped by the metal layer.

10. A display device comprising:
    a substrate including a display area in which are defined:
    an opening having a shape which defines an outer edge;
    a plurality of display elements including a first display element and a second display element which are spaced apart each other with the opening therebetween; and
    a non-display area respectively between the opening and each of the plurality of display elements;
    a signal wiring electrically connecting the first and second display elements to each other, a portion of the signal wiring being in the non-display area within the display area and extended along the outer edge of the opening;
    an input sensing layer on the plurality of display elements and including a plurality of sensing electrodes; and
    a metal layer being in the non-display area within the display area, the metal layer extended along outer edge of the opening and disposed on a same layer as one of the plurality of sensing electrodes.

11. The display device of claim 10, wherein in the non-display area within the display area, the portion of the signal wiring is between the substrate and the metal layer and is overlapped by the metal layer.

12. The display device of claim 10, wherein the metal layer a plurality of segments arranged spaced apart from each other along the outer edge of the opening.

13. The display device of claim 10, wherein the plurality of sensing electrodes includes:
    first sensing electrodes arranged along a first direction, and
    second sensing electrodes arranged along a second direction which intersects with the first direction.

14. The display device of claim 13, wherein
    the metal layer and the first sensing electrodes are respectively portions of a same material layer, or
    the metal layer and the second sensing electrodes are respectively portions of a same material layer.

15. A display device comprising:
    a substrate including a display area in which are defined:
    an opening having a shape defining an outer edge;
    a plurality of display elements in the display area;
    an input sensing layer on the display elements, the input sensing layer including a plurality of sensing electrodes; and
    a non-display area respectively between the opening and each of the plurality of sensing electrodes;
    a connection wiring being in the non-display area within the display area and electrically connecting the plurality of sensing electrodes to each other, the connection wiring extended along the outer edge of the opening, and
    a metal layer being in the non-display area within the display area and extended along the connection wiring, the metal layer disposed on a same layer as one of the plurality of sensing electrodes.

16. The display device of claim 15, wherein the plurality of sensing electrodes of the input sensing layer includes:
    first sensing electrodes arranged along a first direction, and
    second sensing electrodes arranged along a second direction which intersects with the first direction.

17. The display device of claim 16, wherein the metal layer includes a plurality of segments in the non-display area.

18. The display device of claim 17, wherein
    a first sensing electrode among the first sensing electrodes and a second sensing electrode among the second sensing electrodes are arranged adjacent to each other along the opening,
    the plurality of segments of the metal layer includes:

a first segment connected to the first sensing electrode, and a second segment connected to the second sensing electrode.

19. The display device of claim 17, wherein the plurality of segments are spaced apart from each other along the outer edge of the opening.

20. The display device of claim 15, wherein the metal layer and one of the plurality of sensing electrodes comprises a same material.

* * * * *